(12) United States Patent
Na et al.

(10) Patent No.: US 12,237,185 B2
(45) Date of Patent: Feb. 25, 2025

(54) LASER MACHINING APPARATUS AND LASER MACHINING METHOD

(71) Applicant: Samsung Display Co., LTD., Yongin-si (KR)

(72) Inventors: Heung Yeol Na, Suwon-si (KR); Tae Hun Kim, Suwon-si (KR); Jung Woo Choi, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 603 days.

(21) Appl. No.: 17/588,535

(22) Filed: Jan. 31, 2022

(65) Prior Publication Data

US 2022/0384219 A1 Dec. 1, 2022

(30) Foreign Application Priority Data

Jun. 1, 2021 (KR) .................. 10-2021-0070516

(51) Int. Cl.
*B23K 26/12* (2014.01)
*B23K 26/00* (2014.01)
*B23K 26/16* (2006.01)
*B65H 23/00* (2006.01)
*B65H 75/44* (2006.01)
(Continued)

(52) U.S. Cl.
CPC .... *H01L 21/67115* (2013.01); *B23K 26/0006* (2013.01); *B23K 26/009* (2013.01); *B23K 26/127* (2013.01); *B23K 26/16* (2013.01); *B65H 23/00* (2013.01); *B65H 75/4481* (2013.01); *H01L 21/67282* (2013.01);
(Continued)

(58) Field of Classification Search
CPC ......... H01L 21/67115; H01L 21/67282; B23K 26/0006; B23K 26/009; B23K 26/127; B23K 26/16; B23K 2103/56; B65H 23/00; B65H 75/4481; B65H 2301/314; B65H 2301/50
USPC ....................................................... 219/385
See application file for complete search history.

(56) References Cited

U.S. PATENT DOCUMENTS 4,278,867 A * 7/1981 Tan ..................... B23K 26/123
219/121.64
4,434,189 A * 2/1984 Zaplatynsky ............. C23C 8/06
427/586
(Continued)

FOREIGN PATENT DOCUMENTS

CN 107104187 8/2017
CN 112404696 2/2021
(Continued)

*Primary Examiner* — Jimmy Chou
(74) *Attorney, Agent, or Firm* — CANTOR COLBURN LLP

(57) ABSTRACT

A laser machining apparatus includes, a processing chamber, a window disposed in a surface of the processing chamber, a substrate carrier disposed inside the processing chamber and facing the window, a laser irradiator which irradiates a laser onto the substrate carrier through the window, a protector supplier disposed on a side of the processing chamber, a protector retriever disposed on an opposite side of the processing chamber opposite to the side of the processing chamber, and a protector which connects the protector supplier with the protector retriever, where at least a portion of the protector is disposed between the substrate carrier and the window in the processing chamber.

20 Claims, 40 Drawing Sheets

(51) Int. Cl.
*H01L 21/67* (2006.01)
*B23K 103/00* (2006.01)

(52) U.S. Cl.
CPC .... *B23K 2103/56* (2018.08); *B65H 2301/314* (2013.01); *B65H 2301/50* (2013.01)

(56) References Cited

U.S. PATENT DOCUMENTS

| | | | | |
|---|---|---|---|---|
| 5,049,720 | A * | 9/1991 | Fang | B29C 66/131 219/121.84 |
| 5,085,166 | A * | 2/1992 | Oka | C23C 14/28 118/727 |
| 5,227,608 | A * | 7/1993 | Yoshida | B23K 26/16 219/121.84 |
| 5,275,214 | A * | 1/1994 | Rehberger | B23K 26/142 141/97 |
| 5,322,988 | A * | 6/1994 | Russell | H01L 31/0236 216/75 |
| 5,669,979 | A * | 9/1997 | Elliott | H01L 21/02052 134/1 |
| 6,166,509 | A * | 12/2000 | Wyka | G05B 19/404 414/936 |
| 6,407,373 | B1 * | 6/2002 | Dotan | H01L 29/7834 257/E29.267 |
| 6,473,989 | B2 * | 11/2002 | Kato | H01L 21/67736 414/217 |
| 6,650,464 | B2 * | 11/2003 | Akai | H10K 71/18 315/111.21 |
| 6,707,544 | B1 * | 3/2004 | Hunter | G01N 21/956 356/237.4 |
| 7,097,712 | B1 * | 8/2006 | Yamazaki | H01L 29/66757 118/900 |
| 7,880,138 | B2 * | 2/2011 | Lee | G01N 21/718 250/288 |
| 8,099,192 | B2 * | 1/2012 | Genetti | B25J 9/1694 414/730 |
| 8,115,180 | B2 * | 2/2012 | Doemer | B23K 26/082 250/442.11 |
| 8,546,717 | B2 * | 10/2013 | Stecker | B22F 12/38 219/121.13 |
| 9,816,946 | B2 * | 11/2017 | Stegmann | G01N 23/04 |
| 9,929,034 | B2 * | 3/2018 | Goto | H01L 21/67778 |
| 2002/0170891 | A1 * | 11/2002 | Boyle | B23K 26/123 216/13 |
| 2003/0106881 | A1 * | 6/2003 | Lee | H01J 37/32082 219/121.68 |
| 2004/0016888 | A1 * | 1/2004 | Haraguchi | H01J 37/28 250/311 |
| 2004/0240971 | A1 * | 12/2004 | Tezuka | H01L 21/67742 414/217 |
| 2008/0067160 | A1 * | 3/2008 | Suutarinen | B23K 26/1224 219/121.67 |
| 2010/0051828 | A1 * | 3/2010 | Doemer | B23K 26/032 250/492.1 |
| 2010/0108648 | A1 * | 5/2010 | Koseki | B23K 26/12 219/121.84 |
| 2011/0163068 | A1 * | 7/2011 | Utlaut | G03F 1/84 216/66 |
| 2011/0198326 | A1 * | 8/2011 | Doemer | B23K 26/032 219/121.72 |
| 2012/0043460 | A1 * | 2/2012 | Wouters | H01J 49/0404 250/288 |
| 2012/0071003 | A1 * | 3/2012 | Dobashi | H01L 21/306 438/758 |
| 2012/0132799 | A1 * | 5/2012 | Takahashi | H01J 49/0004 250/288 |
| 2013/0098888 | A1 * | 4/2013 | Ebara | H01L 21/67115 219/200 |
| 2013/0122687 | A1 * | 5/2013 | Holden | H01L 21/78 219/385 |
| 2013/0213945 | A1 * | 8/2013 | Stegmann | G01N 23/04 219/121.83 |
| 2013/0341313 | A1 * | 12/2013 | Himmelsbach | B23K 26/70 219/121.86 |
| 2017/0304951 | A1 * | 10/2017 | Lee | B23K 26/1464 |
| 2018/0333806 | A1 * | 11/2018 | Cherubini | B23K 26/0876 |
| 2021/0053159 | A1 | 2/2021 | Lee et al. | |
| 2022/0033195 | A1 * | 2/2022 | Bae | B23K 26/38 |
| 2022/0037186 | A1 * | 2/2022 | Jang | H01L 21/6875 |

FOREIGN PATENT DOCUMENTS

| | | |
|---|---|---|
| KR | 101759522 | 7/2017 |
| KR | 1020170081326 | 7/2017 |
| KR | 1020180060322 | 6/2018 |
| KR | 1020180077939 | 7/2018 |
| KR | 1020210014861 | 2/2021 |
| KR | 1020210024344 | 3/2021 |

* cited by examiner

PM: 1200, 1300

LASER MACHINING APPARATUS AND LASER MACHINING METHOD

This application claims priority to Korean Patent Application No. 10-2021-0070516, filed on Jun. 1, 2021, and all the benefits accruing therefrom under 35 U.S.C. § 119, the content of which in its entirety is herein incorporated by reference.

BACKGROUND

1. Field

Embodiments of the invention relate to a laser machining apparatus and a laser machining method.

2. Description of the Related Art

Display devices become more and more important as multimedia technology evolves. Accordingly, a variety of types of the display devices such as organic light-emitting display ("OLED") devices and liquid-crystal display ("LCD") devices, are currently used.

A display device is fabricated through a variety of physical or chemical processes. A variety of processes using a laser may be carried out during processes of fabricating the display device, for example.

SUMMARY

During the processes of fabricating a display device, particles may be peeled off from a substrate in a process using a laser and may float or fall. Such particles may lower the efficiency of the laser processing.

Features of the invention provide a laser machining apparatus that may collect and remove particles with a high processing efficiency.

It should be noted that features of the invention are not limited to the above-mentioned feature, and other features of the invention will be apparent to those skilled in the art from the following descriptions.

By embodiments of the invention, a laser machining apparatus may be implemented easily, may have a high operation rate, and may increase the reliability of the laser processing facility.

It should be noted that effects of the invention are not limited to those described above and other effects of the invention will be apparent to those skilled in the art from the following descriptions.

In an embodiment of the invention, a laser machining apparatus includes a processing chamber, a window disposed in a surface of the processing chamber, a substrate carrier disposed inside the processing chamber and facing the window, a laser irradiator which irradiates a laser onto the substrate carrier through the window, a protector supplier disposed on a side of the processing chamber, a protector retriever disposed on an opposite side of the processing chamber opposite to the side of the processing chamber, and a protector which connects the protector supplier with the protector retriever, where at least a portion of the protector is disposed between the substrate carrier and the window in the processing chamber.

In an embodiment, the protector supplier and the protector retriever may move the protector from the protector supplier toward the protector retriever in a first mode.

In an embodiment, the protector supplier and the protector retriever may move the protector from the protector retriever toward the protector supplier in a second mode.

In an embodiment, a laser machining apparatus may further include a tension device which is disposed on the protector and maintains tension of the protector.

In an embodiment, the protector may include a film having flexibility and laser transmittance.

In an embodiment, the protector may include at least one of polyethylene terephthalate ("PET"), polyvinyl chloride ("PVC"), polypropylene ("PP") and polyethylene ("PE").

In an embodiment, a laser machining apparatus may further include a cleaning device which cleans the protector retrieved in the protector retriever.

In an embodiment, the protector supplier may include a feed roll, and the protector retriever may include a take-up roll, and where the protector is wound around the feed roll and the take-up roll.

In an embodiment, the feed roll may rotate in a direction in which the protector is unwound, and the take-up roll rotates in a same rotational direction and at a same rotational speed as those of the feed roll.

In an embodiment, the protector may define a closed loop between the feed roll and the take-up roll.

In an embodiment, a laser machining apparatus may further include a cleaning device which cleans the protector retrieved in the protector retriever.

In an embodiment, the protector may include a protector supplying portion engaging with a lower end of the feed roll and a lower end of the take-up roll and extended from the protector supplier to the protector retriever, a protector retrieving portion engaging with an upper end of the feed roll and an upper end of the take-up roll and extended from the protector retriever to the protector supplier, and a protector connecting portion connecting the protector supplying portion with the protector retrieving portion in a region where the protector engages with the feed roll and with the take-up roll.

In an embodiment, the substrate carrier may be disposed between the protector supplying portion and the protector retrieving portion.

In an embodiment of the invention, a laser machining apparatus includes a processing chamber comprising a process area in which a target substrate is processed, and a first gate through which the target substrate is loaded into the process area in a first direction, a laser irradiator which irradiates a laser onto the process area in a second direction intersecting the first direction, and a protector driver which provides a protector into the processing chamber in a third direction intersecting the first direction and the second direction.

In an embodiment, the first direction, the second direction and the third direction may be perpendicular to one another.

In an embodiment, the processing chamber may further include a second gate through which the target substrate is unloaded, where the second gate is disposed on an opposite side of the first gate, with the processing chamber therebetween.

In an embodiment, the protector driver may include a protector supplier which supplies the protector, and a protector retriever which retrieves the protector.

In an embodiment, a laser machining apparatus may further include a first chamber disposed adjacent to one side of the processing chamber, and a second chamber disposed adjacent to an opposite side of the processing chamber, where the protector supplier is disposed inside the first chamber, and the protector retriever is disposed inside the second chamber.

In an embodiment, a laser machining apparatus may further include a gate valves disposed between the first chamber and the processing chamber and between the second chamber and the processing chamber, respectively.

In an embodiment, the protector supplier and the protector retriever may be disposed inside the processing chamber.

BRIEF DESCRIPTION OF THE DRAWINGS

The above and other advantages and features of the invention will become more apparent by describing in detail embodiments thereof with reference to the attached drawings, in which.

DETAILED DESCRIPTION

Figure 1:
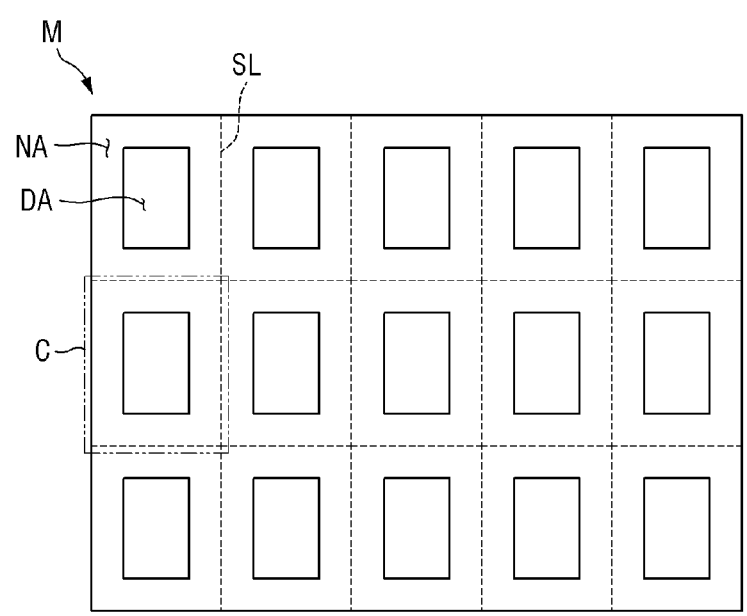
FIG. 1 is a plan view of display devices in the form of a mother substrate.

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this invention will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

"The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a plan view of display devices in the form of a mother substrate.

Referring to FIG. 1, display devices may be fabricated on a single mother substrate M including a plurality of cells C thereon as shown in FIG. 1. The mother substrate M includes a plurality of display device cells C. The plurality of display device cells C may be arranged in a matrix array. Each of the display device cells C may include a display area DA and a non-display area NA surrounding the display area DA. The non-display area NA of a display device cell C may be connected to the non-display area NA of another adjacent display device cell C.

Scribing lines SL are defined between the display device cells C and illustrated as dashed lines as shown in FIG. 1. The scribing line SL may be extended cross the non-display area NA of the adjacent display device cells C. A plurality of display devices may be simultaneously fabricated in the form of the mother substrate M. Subsequently, a process of cutting the mother substrate M along the scribing lines SL is carried out, to yield the display devices (or display device cells C).

The process of fabricating the display devices on a mother substrate M may include at least one laser processing. The laser processing is carried out by irradiating a target substrate with a laser, and may include an etching process, a cutting process, a melting process, a repair process, etc.

Figure 2:
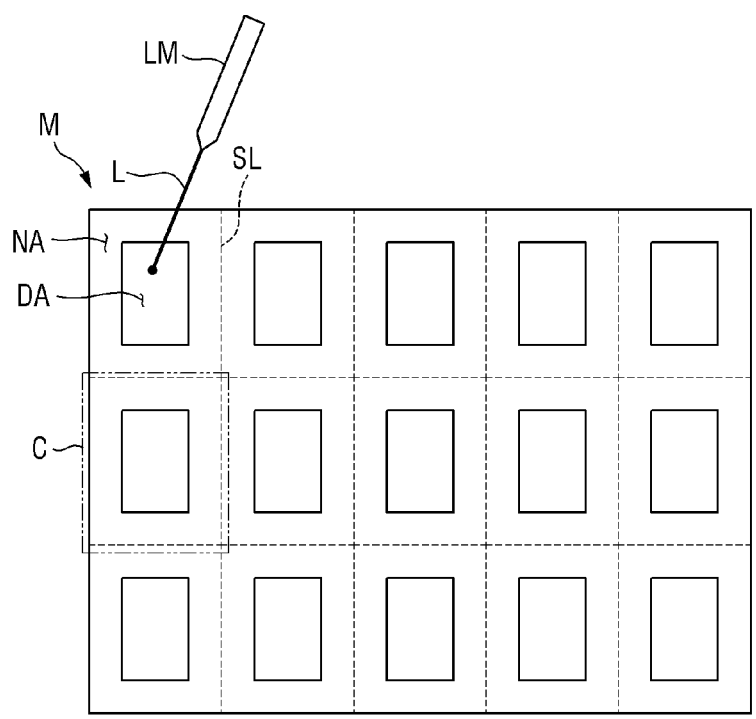
FIG. 2 is a view showing a process of forming a laser hole in the mother substrate.
Figure 3:
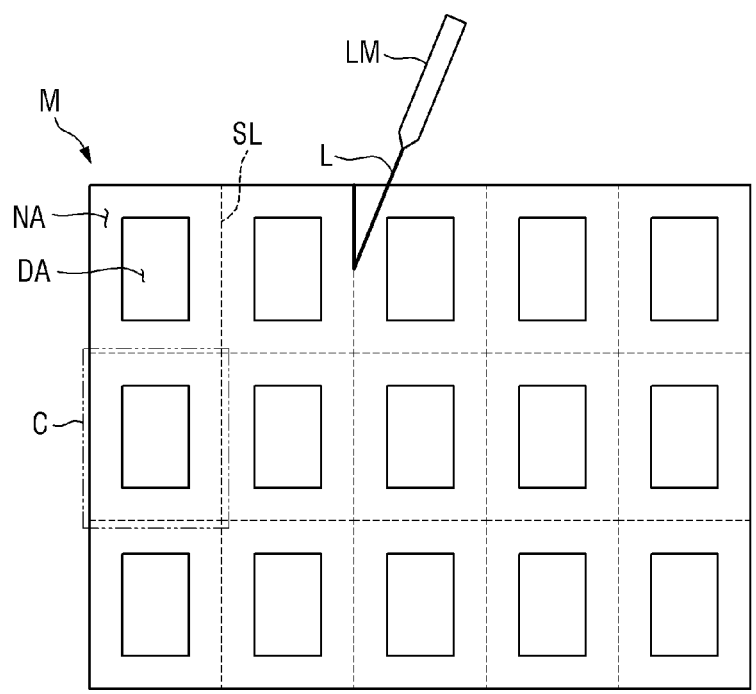
FIG. 3 is a view showing a process of scribing a mother substrate with a laser.
Figure 4:
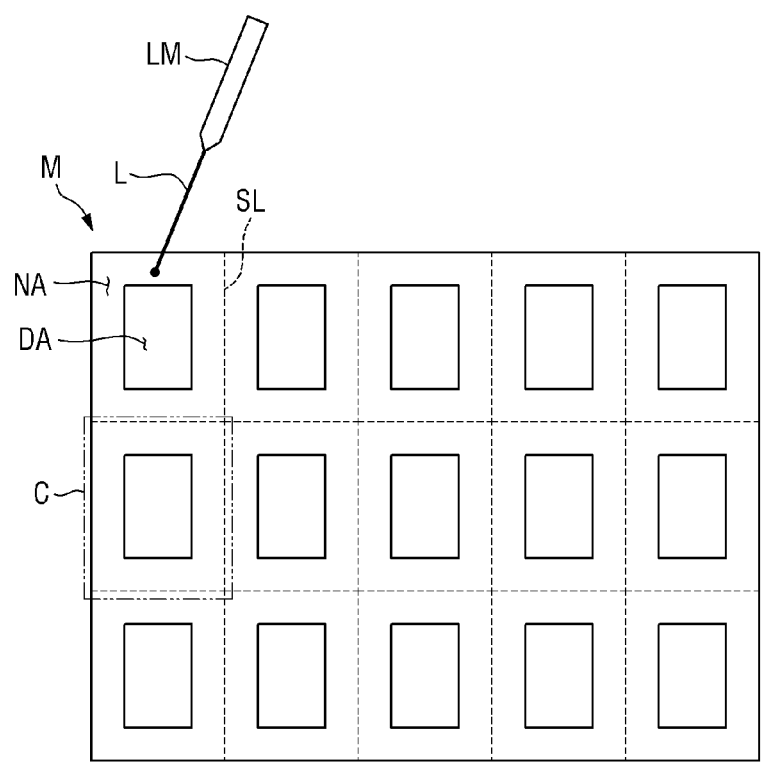
FIG. 4 is a view showing a process for conductive patterns on a mother substrate.

FIGS. 2 to 4 show embodiments of laser processing carried out on the mother substrate M.

FIG. 2 is a view showing a process of defining a laser hole in the mother substrate.

Referring to FIG. 2, when an optical hole such as a camera hole is defined in a display device, a physical optical hole may be defined by perform a process by laser machining apparatus on a target substrate. A laser beam L emitted from a laser irradiator LM and incident on the target substrate at least partially removes a portion by etching or the like. By doing so, an optical hole may be defined, from which at least some layers are removed. In an embodiment of the invention, as shown in FIG. 2, an optical hole may be defined inside the display area DA. It should be understood, however, that the invention is not limited thereto. An optical hole may be defined in the non-display area NA. The optical hole is an example of a result that may be defined by laser hole processing. The laser hole processing process may be performed not only in the optical hole formation process but also in the formation process of other holes defined in the display device.

FIG. 3 is a view showing a process of scribing a mother substrate with a laser.

As shown in FIG. 3, the mother substrate M may be divided into a plurality of display device cells C by irradiating a laser onto the laser scribing lines SL by laser machining apparatus.

FIG. 4 is a view showing a process for conductive patterns on a mother substrate.

Referring to FIG. 4, laser processing may be carried out to electrically connect a plurality of conductive patterns separated from one another. A laser irradiated onto a workpiece may melt and/or etch the conductive patterns and nearby insulating films to electrically connect the conductive patterns. Although a portion in the non-display area NA is processed in the example shown in FIG. 4, a portion of the display area DA may be processed as well.

Typically, such laser processing is carried out inside a chamber. Such laser processing involves the removal of at least some materials, and the removed material may float or fall inside the chamber in the form of particles. More detailed description thereon will be given with reference to FIGS. 5 and 6.

Figure 5:
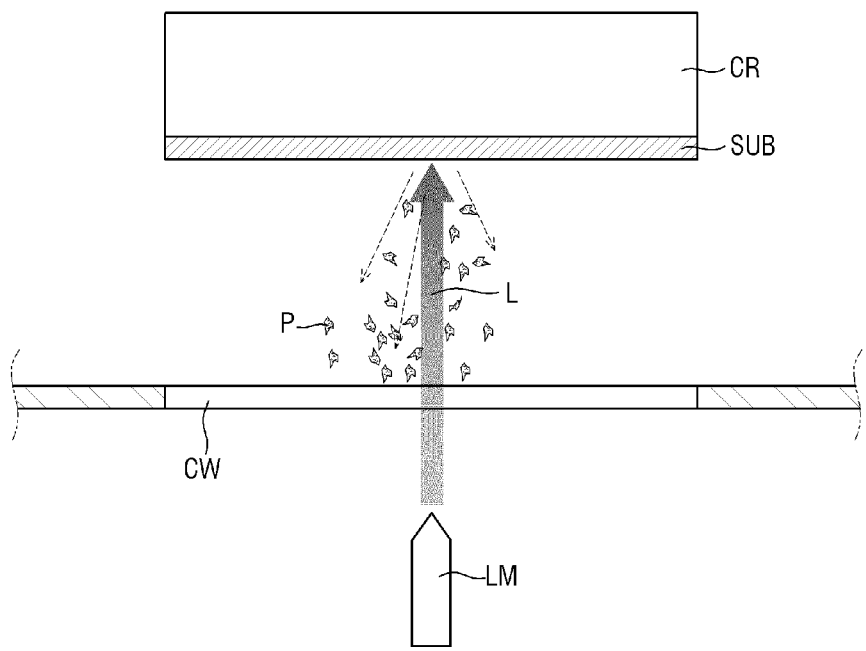
FIGS. 5 and 6 are views showing how particles are formed during laser processing on a target substrate.
Figure 6:
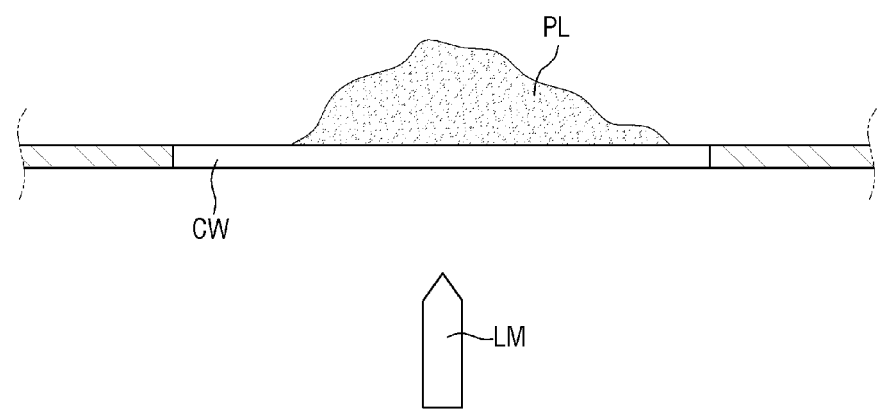

FIGS. 5 and 6 are views showing how particles are formed during laser processing on a target substrate.

Herein, a substrate is a workpiece for laser processing according to the invention. Any kind of substrate may be employed, such as an organic light-emitting display device using organic light-emitting diodes ("LEDs") including organic emissive layer, a micro-LED display device using micro-LEDs, a quantum-dot light-emitting display device including quantum-dot LEDs including an quantum-dot emissive layer, and an inorganic light-emitting display device using inorganic light-emitting elements including an inorganic semiconductor. It should be noted that the substrate SUB encompasses both the mother substrate M and the display device cells C described above with reference to FIGS. 1 to 4. In other words, the substrate SUB may refer to the mother substrate M (refer to FIG. 1) described above with reference to FIGS. 1 to 4. In an alternative embodiment, the substrate SUB may refer to the display device cells C (refer to FIG. 1) obtained by scribing the mother substrate M (refer to FIG. 1).

Referring to FIGS. 5 and 6, the laser processing may include aligning a substrate carrier CR on which the substrate SUB is seated with a laser irradiator LM, and oscillating the laser irradiator LM to emit a laser beam L, so that the laser beam L transmits a chamber window CW and reaches the substrate SUB, as shown in FIG. 5. That is to say, the substrate may be seated on a process area and subjected to the laser processing. During the processing the substrate SUB using the laser beam L, particles P peeled off from the substrate SUB may be created. Although there may be a plurality of laser beams L, FIG. 5 shows only one laser beam L for convenience of illustration.

Particles P (refer to FIG. 5) that are peeled off from the substrate SUB may fall onto the chamber window CW to form a pile of particles PL on the chamber window CW as shown in FIG. 6. The pile of particles PL formed on the chamber window CW may block the path of the laser beam L emitted from the laser irradiator LM. As a result, the transmittance of the laser beam L transmitting the chamber window CW may be lowered. When this happens, the intensity of the laser beam L provided to the substrate SUB becomes weaker, and the time desired to process the substrate SUB increases, thereby reducing the operation rate of the laser machining apparatus.

A laser machining apparatus will be described in detail, in which a protector is disposed in a process area that blocks particles from reaching a chamber window in order to prevent a decrease in the operation rate of the laser machining apparatus due to such particles.

Hereinafter, embodiments of the invention will be described with reference to the accompanying drawings. As used herein, a first direction DR1 indicates the y-axis direction, a second direction DR2 indicates the x-axis direction, and a third direction DR3 indicates the z-axis direction.

Figure 7:
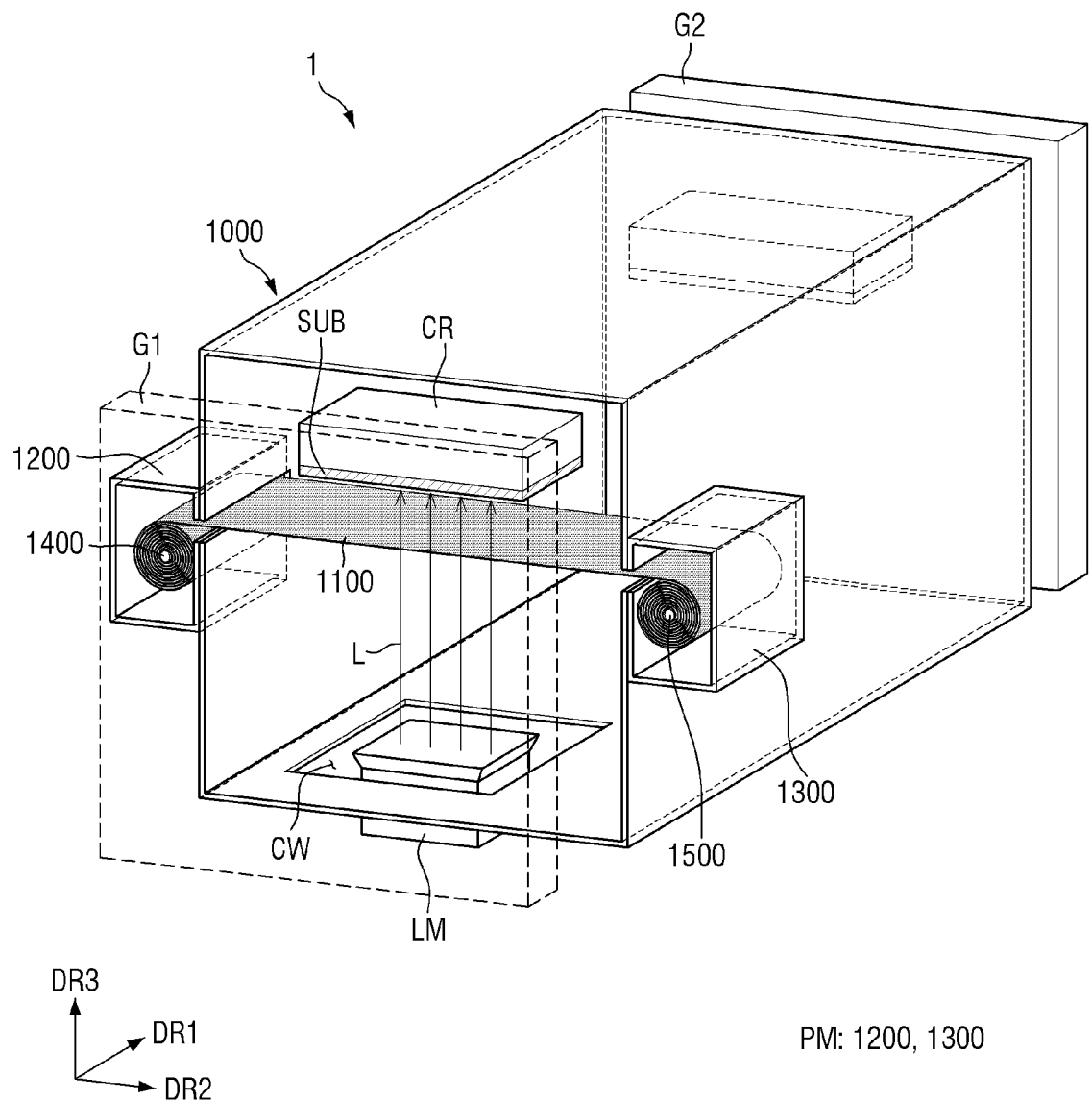
FIG. 7 is a perspective view of an embodiment of a laser machining apparatus according to the invention.
Figure 8:
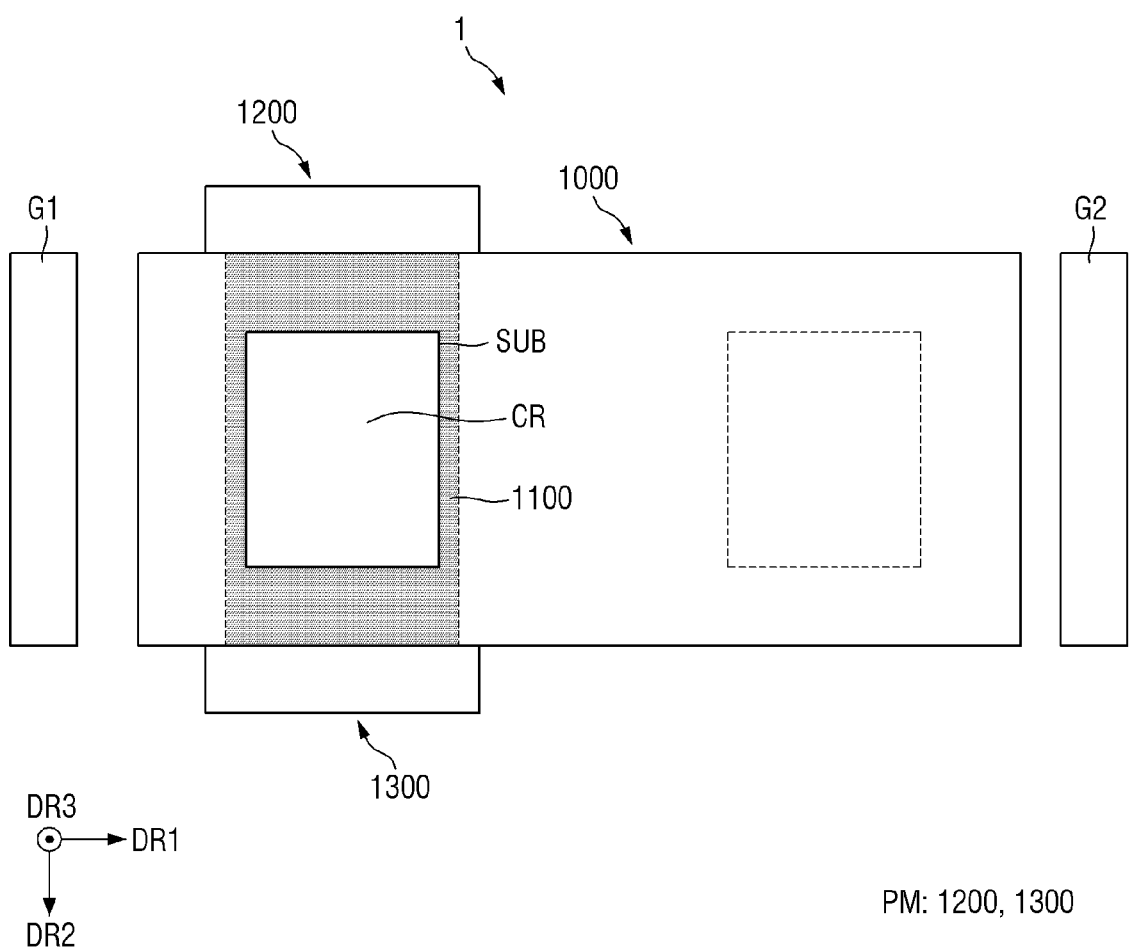
FIG. 8 is a plan view of an embodiment of the laser machining apparatus according to the invention when viewed in the third direction DR3.
Figure 9:
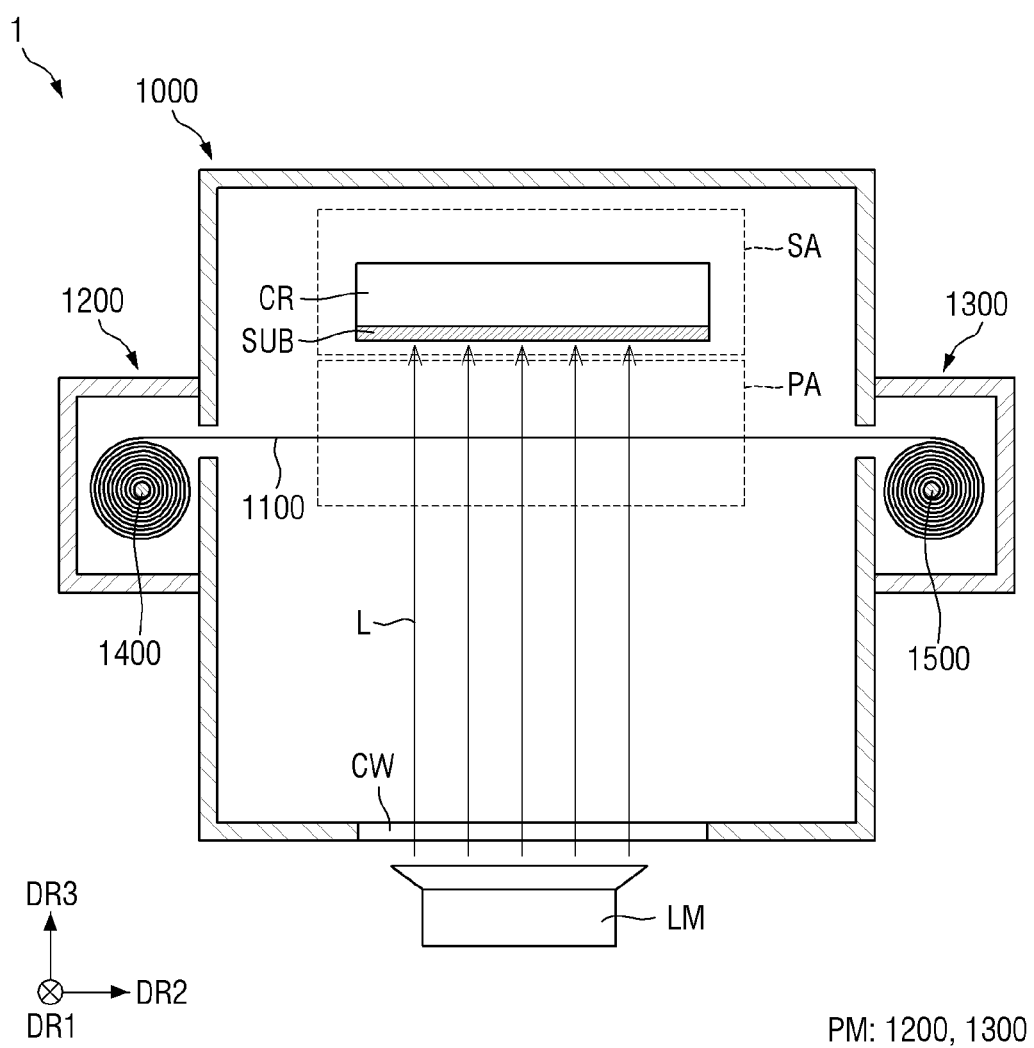
FIG. 9 is a cross-sectional view of an embodiment of the laser machining apparatus according to the invention when viewed in the first direction DR1.

FIG. 7 is a perspective view of an embodiment of a laser machining apparatus according to the invention. FIG. 8 is a plan view of an embodiment of the laser machining apparatus according to the invention when viewed in the third direction DR3. FIG. 9 is a cross-sectional view of the laser machining apparatus in an embodiment of the invention when viewed in the first direction DR1.

Referring to FIGS. 7 to 9, a laser machining apparatus 1 in an embodiment of the invention may include a processing chamber 1000, a substrate carrier CR, a laser irradiator LM, a chamber window CW, a protector 1100, and a protector driver PM. In addition, the protector driver PM may include a protector supplier 1200 and a protector retriever 1300.

The processing chamber 1000 may provide a space where laser processing is carried out.

In some embodiments, the processing chamber 1000 may include longer sides in the first direction DR1, shorter sides in the second direction DR2, and shorter sides in the third direction DR3 as shown in FIGS. 7 to 9.

In some embodiments, the processing chamber 1000 may have a cuboid shape. It should be understood, however, that the invention is not limited thereto. The shape of the processing chamber 1000 may be altered in a variety of ways. In the following description, it is assumed that the processing chamber 1000 has a cuboid shape for convenience of illustration.

As shown in FIG. 7, the processing chamber 1000 having a cuboid shape may include a front face and a rear face in the first direction DR1, a left face and a right face in the second direction DR2, and a lower face and an upper face in the third direction DR3.

The substrate carrier CR is a part on which a workpiece, i.e., the substrate SUB is seated and supported. In some embodiments, the substrate carrier CR may fix the substrate SUB. In an embodiment, the substrate carrier CR may include an electrostatic chuck (not shown) for fixing the substrate SUB or a vacuum suction unit (not shown) for vacuum adsorption.

Referring to FIG. 9, the chamber window CW may be formed or provided in the lower surface of the processing chamber 1000, the protector supplier 1200 may be disposed on the left side surface, and the protector retriever 1300 may be disposed on the right side surface of the processing chamber 1000. In the processing chamber 1000, the chamber window CW, the protector 1100, the substrate SUB, and the substrate carrier CR may be disposed in this order in the direction indicated by the arrow of the third direction DR3, but the invention is not limited thereto.

As shown in FIG. 9, the processing chamber 1000 may include a substrate seating space SA in which the substrate SUB adsorbed to the substrate carrier CR is seated, and a process area PA in which a laser beam L is irradiated onto one surface of the seated substrate SUB to carry out laser processing.

The substrate seating space SA is an area inside the processing chamber 1000, and the positions of the substrate carrier CR and the substrate SUB adsorbed to the substrate carrier CR are fixed during the laser processing on the substrate SUB in the processing chamber 1000. In some embodiments, the substrate SUB adsorbed to the substrate carrier CR may be aligned with the laser irradiator LM in the substrate seating space SA.

The process area PA is an area inside the processing chamber 1000. A space in which the laser processing is carried out on the substrate SUB in the processing chamber 1000, and a space in which particles peeled off from the substrate SUB are collected on the protector 1100 may be defined in the process area PA. In other words, the process area PA may refer to an area inside the processing chamber 1000 which includes the substrate SUB and the protector 1100 where the substrate SUB and the chamber window CW overlap each other in the third direction DR3. The substrate seating space SA and the process area PA may overlap each other in the third direction DR3 inside the processing chamber 1000, and the substrate seating space SA and the process area PA may overlap each other partially.

Incidentally, when a laser is irradiated toward the substrate SUB from above the substrate SUB, particles may be peeled off from the substrate SUB by the laser processing and fall onto display devices. As a result, particles falling on the display devices may deteriorate the reliability of the display devices.

In this embodiment, the chamber window CW is disposed below the process area PA, the laser irradiator LM irradiates the laser beam L toward the substrate SUB in the third direction DR3 through the chamber window CW, and the substrate SUB faces the chamber window CW, so that particles do not fall onto the display devices but onto the chamber window CW (downward laser machining apparatus), as shown in FIGS. 7 to 9.

The processing chamber 1000 may be maintained in a vacuum by a vacuum pump and a vacuum valve (not shown). Accordingly, when the substrate SUB to be subjected to the laser processing includes an organic material, it is possible to provide the deterioration of the organic material included in the substrate deterioration.

The substrate carrier CR may be disposed inside the processing chamber 1000. As shown in FIG. 8, the substrate carrier CR may adsorb the substrate SUB thereon and move the substrate SUB in the first direction DR1 in the processing chamber 1000, and may include a member for adsorbing the substrate SUB, e.g., an electrostatic chuck (not shown), a vacuum adsorption module, etc. The substrate carrier CR may move the substrate SUB into the substrate seating space SA to fix the substrate SUB buffer the laser processing, may move the substrate SUB during laser processing on the substrate SUB according to the progress of the laser processing, or may move the substrate SUB out of the substrate seating space SA and the process area PA after the laser processing.

Referring to FIGS. 7 and 8, a first gate G1 may be disposed on the front side of the processing chamber 1000, through which the substrate carrier CR including the substrate SUB adsorbed thereon may be loaded onto the processing chamber 1000. The substrate carrier CR may adsorb the substrate SUB to allow the substrate SUB to move in or out of the processing chamber 1000 in the first direction DR1 through the first gate G1. A second gate G2 may be disposed on the rear side of the processing chamber 1000 opposite to the front side of the processing chamber 1000 on which the first gate G1 is disposed. The substrate carrier CR may adsorb the substrate SUB to allow the substrate SUB to move in the processing chamber 1000 through the first gate G1 and to move out of the processing chamber 1000 through the second gate G2. Although the manner of moving the substrate SUB by the substrate carrier CR has been described above, the manner of moving the substrate SUB is not limited thereto.

The laser irradiator LM may be disposed outside the processing chamber 1000 as shown in FIGS. 7 and 9. In FIG. 7, the laser irradiator LM is disposed under the processing chamber 1000. It should be understood, however, that the position of the laser irradiator LM is not limited thereto as long as the laser beam L may be provided to the substrate in the third direction DR3 from the chamber window CW. In the following description, it is assumed the laser irradiator LM is disposed under the processing chamber 1000.

The laser irradiator LM may irradiate the laser beam L onto the substrate SUB in the third direction DR3 to process the substrate SUB. The laser beam L emitted from the laser irradiator LM passes through the chamber window CW and other elements and is irradiated to the substrate SUB, to perform the laser processing. Although not shown in the drawings, the laser irradiator LM may include a laser unit, a lens, a mirror, a beam, an expander, a filter, a scanner, etc. Although five laser beams L are depicted in FIGS. 7 and 9, the number of laser beams L is not limited thereto.

The chamber window CW may be disposed in the lower surface of the processing chamber 1000 and may be disposed above the laser irradiator LM. The chamber window CW may be disposed between the laser irradiator LM and the substrate carrier CR (or the substrate SUB). The chamber window CW may overlap the laser irradiator LM, and may overlap the substrate carrier CR (or the substrate SUB) during the processing of the substrate SUB.

In some embodiments, the chamber window CW may include a quartz material. Although the chamber window CW is implemented as a single window in the example shown in FIG. 7, the invention is not limited thereto. Specifically, more than one chamber windows CW may be disposed depending on the number of the laser modules LM.

The chamber window CW may have a quadrangular (e.g., rectangular) shape when viewed from the top. In an embodiment, the chamber window CW may also have, but is not limited to, a circular shape when viewed from the top.

As shown in FIGS. 7 to 9, the protector driver PM may include the protector supplier 1200 and the protector retriever 1300.

The protector 1100 may be extended from the protector supplier 1200 to the protector retriever 1300 through the inside of the processing chamber 1000 as shown in FIGS. 7 and 9. The protector 1100 may be disposed above the chamber window CW in the processing chamber 1000. In addition, the protector 1100 may be disposed between the substrate carrier CR (or the substrate SUB) and the chamber window CW in the processing chamber 1000. That is to say, the protector 1100 may be disposed such that it traverses the process area PA where the substrate carrier CR (or the substrate SUB) and the chamber window CW overlap each other.

One surface of the protector 1100 may face the substrate SUB, while the opposite surface of the protector 1100 may face the chamber window CW. The protector 1100 may transmit the laser beam L and may also collect particles that are peeled off from the substrate SUB and fall onto one surface of the protector 1100 as the laser processing is carried out, thereby preventing the chamber window CW from being contaminated by the particles. Accordingly, since it is possible to prevent refraction or a decrease in transmittance due to particles on the chamber window CW, processing quality may be improved. In addition, it is not necessary to replace or clean the chamber window CW frequently, and thus the processing chamber 1000 is less frequently opened, so that the production efficiency of the laser machining apparatus may be increased.

As shown in FIG. 8, the width of the protector 1100 parallel to the first direction DR1 may be larger than the width of the substrate SUB parallel to the first direction DR1. In addition, the width of the protector 1100 parallel to the second direction DR2 may be wider than the width of the substrate SUB parallel to the second direction DR2. Accordingly, when viewed in the third direction DR3, the edges of the substrate SUB may be disposed inside the edges of the protector 1100. Accordingly, it is possible to prevent particles that are peeled off from the substrate SUB during the laser processing from passing through the protector 1100 and falling onto the chamber window CW.

The protector 1100 may be a film including a laser-transmissive material which has flexibility and allows the laser beam L to transmit. In an embodiment, the protector 1100 may be a film including polyethylene terephthalate ("PET"), polyvinyl chloride ("PVC"), polypropylene ("PP") or polyethylene ("PE"), which laser beam may transmit, for example. It should be understood, however, that the invention is not limited thereto. It is to be understood that the protector 110 may include any other material than the above-listed materials as long as it has flexibility and may transmit a laser beam.

The protector driver PM may include the protector supplier 1200 and the protector retriever 1300. FIGS. 7 to 9 show the protector supplier 1200 and the protector retriever 1300. The protector supplier 1200 and the protector retriever 1300 may be disposed to protrude from the left side and the right side of the processing chamber 1000 to the outside of the processing chamber 1000, respectively. That is to say, the protector supplier 1200 and the protector retriever 1300 may be disposed in separate chambers disposed outside the processing chamber 1000. In the example shown in FIGS. 7 to 9, the protector supplier 1200 is disposed on the left side of the processing chamber 1000 and the protector retriever 1300 is disposed on the right side of the processing chamber 1000, but the positions of the protector supplier 1200 and the protector retriever 1300 are not limited thereto. In an embodiment, the protector supplier 1200 may be disposed on the right side of the processing chamber 1000 and the protector retriever 1300 may be disposed on the left side of the processing chamber 1000, for example. Gate valves (not shown) may be disposed between the protector supplier 1200 and the processing chamber 1000 and between the protector retriever 1300 and the processing chamber 1000, to separate the processing chamber 1000 from the protector supplier 1200 and from the protector retriever 1300. The gate valves may be eliminated.

The width of each of the protector supplier 1200 and the protector retriever 1300 parallel to the first direction DR1 may be larger than the width of the protector 1100 parallel to the first direction DR1, as shown in FIG. 8. In the example shown in FIGS. 7 to 9, the protector supplier 1200 and the protector retriever 1300 have the same width and height and thus the same volume. It should be understood, however, that the width or height of each of the protector supplier 1200 and the protector retriever 1300 is not limited thereto. In addition, as shown in FIGS. 7 and 9, the protector supplier 1200 and the protector retriever 1300 may be disposed outside the processing chamber 1000 between the substrate carrier CR and the laser irradiator LM in the third direction DR3. It should be understood, however, that the invention is not limited thereto.

The protector supplier 1200 may be disposed outside the processing chamber 1000 on the left side of the processing chamber 1000. A space in which the protector 1100 is stored may be defined in the protector supplier 1200. The protector supplier 1200 may include a feed roll 1400. The protector 1100 may be wound around the feed roll 1400. As laser processing proceeds in the processing chamber 1000, the feed roll 1400 rotates so that the protector 1100 wound around the feed roll 1400 is unwound, and the protector 1100 may be released from the feed roll 1400. Accordingly, the protector 1100 may be fed in the second direction DR2 in the processing chamber 1000 in real time and continuously.

The protector retriever 1300 may be disposed outside the processing chamber 1000 on the right side of the processing chamber 1000. A space in which the protector 1100 collecting particles peeled off from the substrate SUB is retrieved may be defined in the protector retriever 1300. The protector retriever 1300 may include a take-up roll 1500. The protector 1100 may be wound around the take-up roll 1500. As the laser processing proceeds in the processing chamber 1000, the take-up roll 1500 rotates with the feed roll 1400 at the same rotational speed and in the same rotational direction as those of the feed roll 1400, so that the protector 1100 collecting the particles peeled off from the substrate SUB is wound around the take-up roll 1500, and may be retrieved in the protector retriever 1300 in real time. That is to say, while the feed roll 1400 and the take-up roll 1500 rotate at the same time, the protector 1100 unwound from the feed roll 1400 is wound around the take-up roll 1500 again and may move from the protector supplier 1200 to the protector retriever 1300.

As shown in FIGS. 7 to 9, the protector 1100 may move in the second direction DR2 inside the processing chamber 1000 by the protector supplier 1200 and the protector retriever 1300 disposed on the left and right sides of the processing chamber 1000, respectively. That is to say, inside the processing chamber 1000, the protector 1100 may move in a second direction DR2 different from the first direction DR1 in which the substrate SUB moves by the substrate carrier CR. Since the processing chamber 1000 includes the longer sides in the first direction DR1 and the shorter sides in the second direction DR2 and the third direction DR3, the traveling distance of the protector 1100 is shorter than the traveling distance of the substrate SUB moving along the longer sides of the processing chamber 1000. Accordingly, the apparatus may be implemented easily, and power consumption for moving the protector 1100 may be saved.

FIGS. 10 to 14 are views showing a process in which particles peeled off from a substrate during laser processing are collected by a protector.

Although one laser beam L is shown in FIGS. 10 to 14 for convenience of illustration, the number of laser beams L is not limited thereto.

Figure 10:
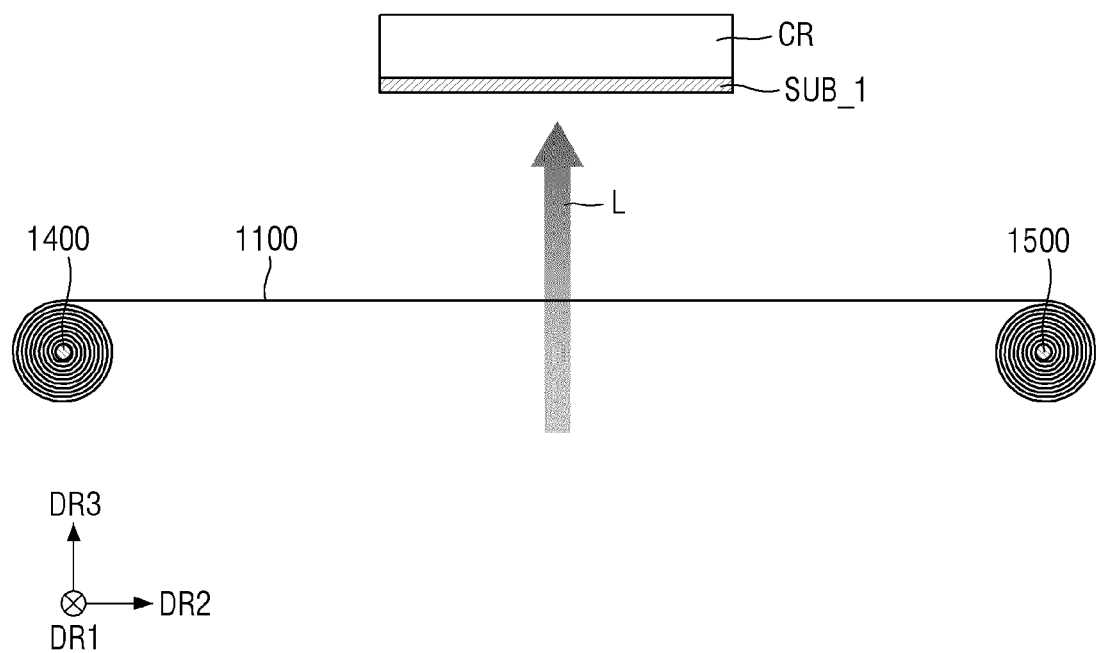
FIGS. 10 to 14 are views showing a process in which particles peeled off from a substrate during laser processing are collected by a protector.
Figure 11:
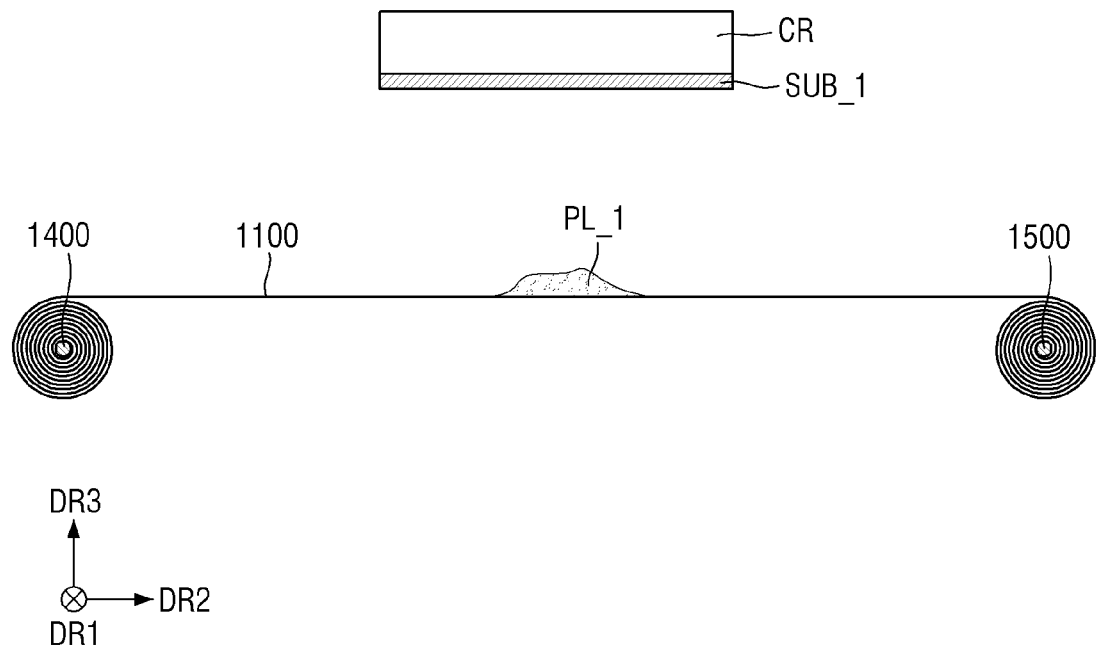

Referring to FIGS. 10 and 11, the particles P (refer to FIG. 5) peeled off from a first substrate SUB_1 in the process by the laser processing may fall onto one surface of the protector 1100 to form a pile of particles PL_1.

Figure 12:
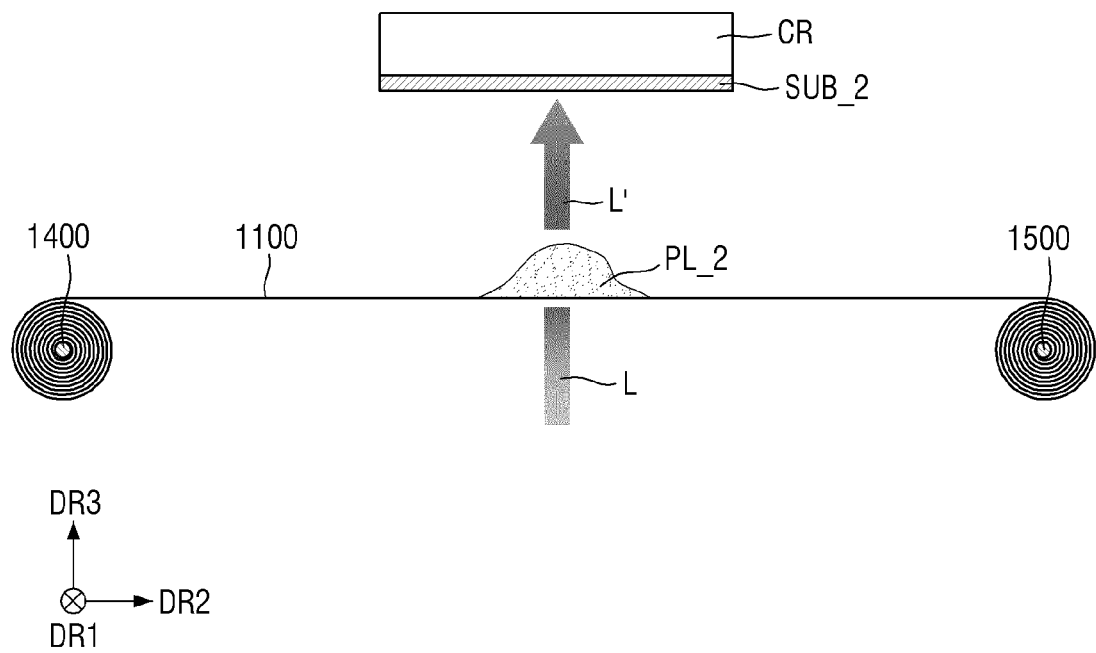

Referring to FIGS. 11 and 12, after the processing of the first substrate SUB_1 has been completed, the first substrate SUB_1 is moved in the processing chamber 1000 in the first direction DR1 by the substrate carrier CR so that it is out of the process area PA of the processing chamber 1000. Then, a second substrate SUB_2 may be seated in the substrate seating space SA of the processing chamber 1000 by the substrate carrier CR and may be disposed in the process area PA. Then, the laser irradiator LM irradiates a laser beam L onto the protector 1100 on which the pile of particles PL_1 is formed by the first substrate SUB_1 to process the second substrate SUB_2 disposed in the process area PA. The intensity of the laser beam L' irradiated onto the second substrate SUB_2 may become weaker as it passes through the pile of particles PL_1 formed by the first substrate SUB_1. Particles P peeled off from the second substrate SUB_2 during the laser processing may be accumulated on the pile of particles PL_1 formed by the first substrate SUB_1, to form a larger pile of particles PL_2.

Figure 13:
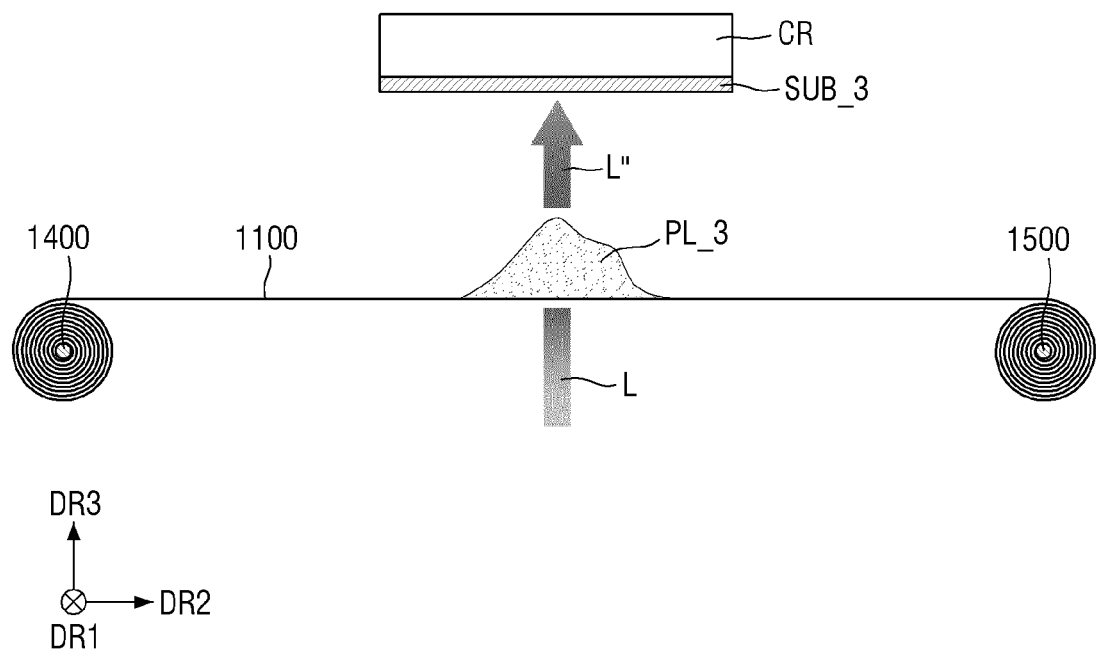

Referring to FIGS. 12 and 13, after the processing of the second substrate SUB_2 has been completed, the second substrate SUB_2 is moved in the processing chamber 1000 in the first direction DR1 by the substrate carrier CR so that it is out of the process area PA of the processing chamber 1000. Then, a third substrate SUB_3 may be seated in the substrate seating space SA of the processing chamber 1000 by the substrate carrier CR and the above-described process is repeated. The intensity of the laser beam L" irradiated onto the third substrate SUB_3 may become weaker as it passes through the pile of particles PL_2 formed by the second substrate SUB_2. Then, a larger pile of particles PL_3 than the pile particles PL_2 formed by the second substrate SUB_2 may be formed. In this manner, while plural substrates SUB are processed sequentially, the protector 1100 may not move and may collect the particles P. As the laser processing proceeds, particles P may be accumulated on the existing pile of particles PL over and over. That is to say, the pile of particles PL formed on the surface of the protector 1100 may be accumulated in a direction of increasing the volume as plural substrates SUB are sequentially processed.

Figure 14:
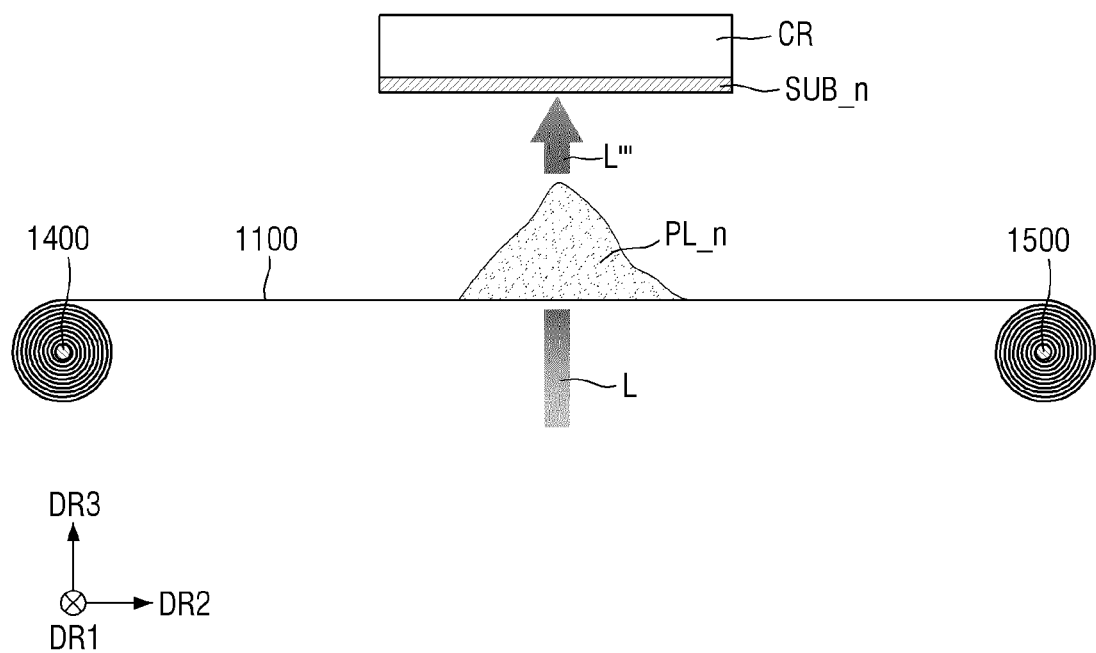

The shape of the accumulated pile of particles PL_n (n is a natural number) may follow a Gaussian distribution that forms a normal distribution with respect to the path in which the laser beam L is irradiated, as shown in FIG. 14.

Referring to FIG. 14, when the particles P are accumulated over and over on the surface of the protector 1100, the pile of particles PL_n becomes thicker, so that the transmittance of the laser beam L passing through the pile of particles PL_n may be reduced, and thus the intensity of the laser beam L''' may become weaker. Accordingly, the efficiency of the laser processing may be lowered. Therefore, in order to recover the efficiency of the laser processing, it is necessary to move the pile of particles PL_n out of the process area PA.

Figure 15:
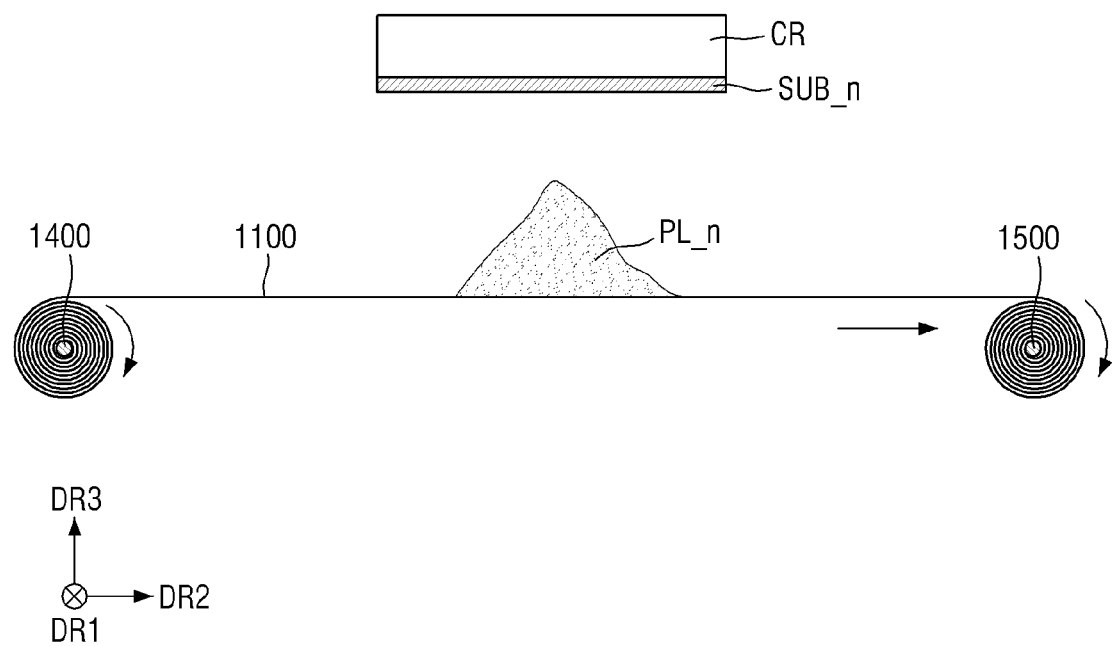
FIGS. 15 to 17 are views showing a process in which the protector moves the collected pile of particles out of the process area.
Figure 16:
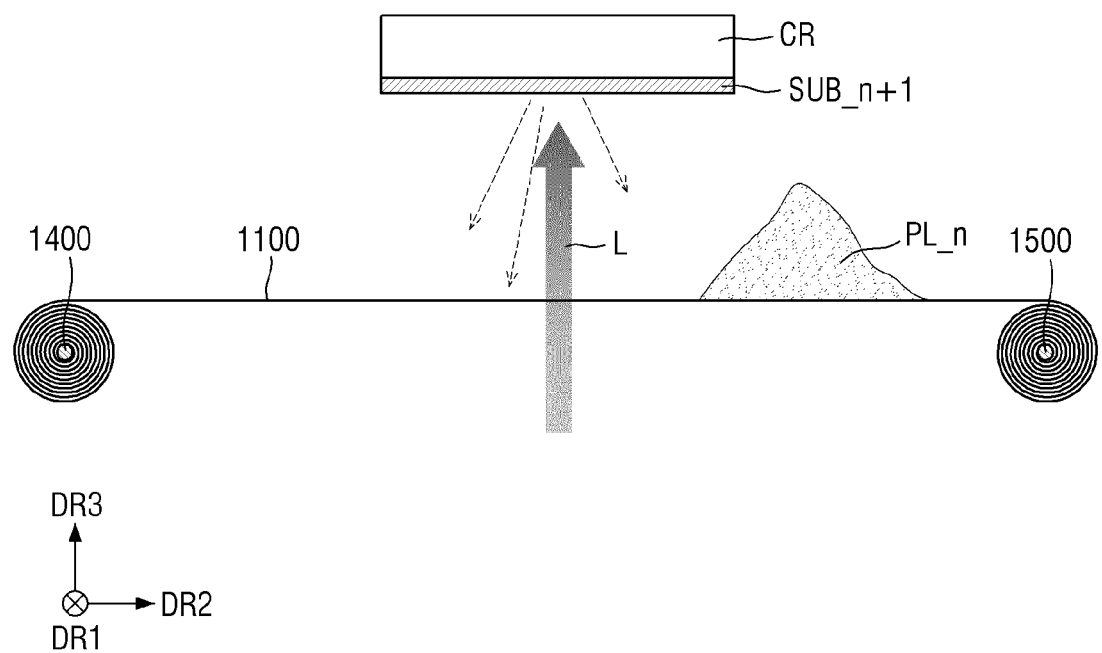
Figure 17:
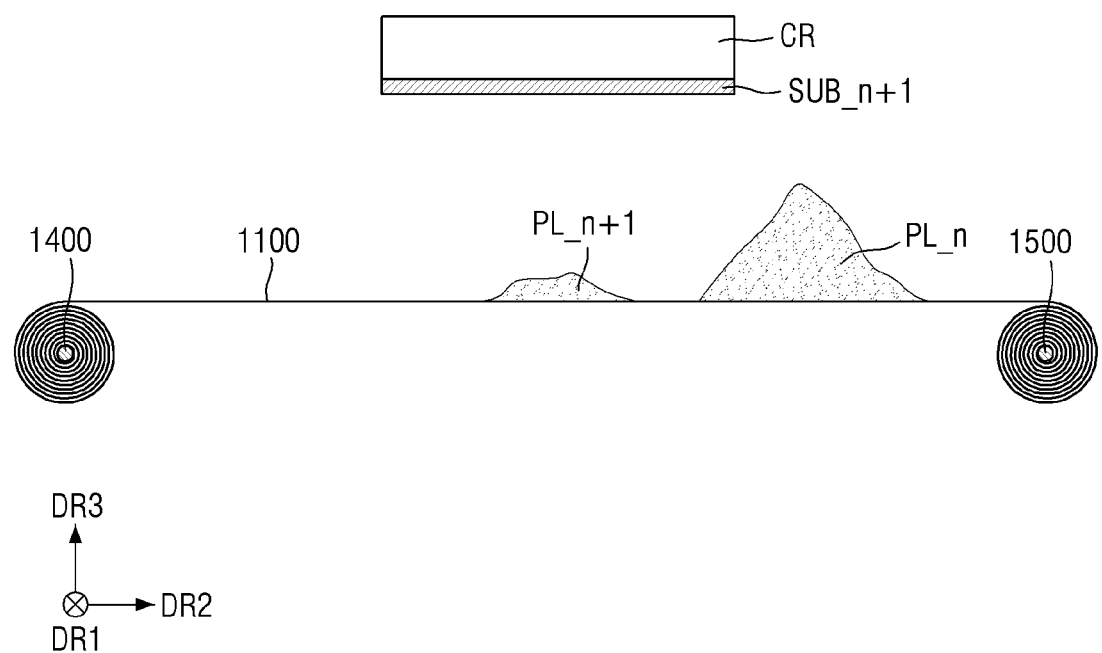

FIGS. 15 to 17 are views showing a process in which the protector moves the collected pile of particles out of the process area.

Referring to FIGS. 15 and 16, when the thickness of the pile of particles PL is substantially great that the efficiency of the laser processing is lowered, the feed roll 1400 of the protector supplier 1200 rotates in a direction in which the protector 1100 wound around the protector supplier 1200 is unwound and the take-up roll 1500 of the protector retriever 1300 rotates in the same direction and speed as those of the feed roll 1400 while the substrate SUB_n on which the laser processing has been completed is replaced with the subsequent substrate SUB_n+1, such that the protector 1100 may be moved in the second direction DR2. In this manner, the pile of particles PL_n rides on the protector 1100 and moves in the direction from the protector supplier 1200 to the protector retriever 1300, i.e., in the second direction DR2, to move out of the process area PA.

Therefore, as shown in FIG. 17, when the laser processing is carried out on the subsequent substrate SUB_n+1, the pile of particles PL is not formed on a part of the protector 1100 in the processing area, so the transmittance of the laser beam L is not lowered. In this instance, the processes of FIGS. 10 to 14 may be performed again when the laser processing is carried out on the subsequent substrate SUB_n+1. In addition, when several substrates SUB are processed after the subsequent substrate SUB_n+1 and the pile of particles PL_n+1 grows to lower the transmittance of the laser beam L, the processes of FIGS. 15 to 17 may be carried out again.

Although the protector 1100 is moved after several substrates SUB have been processed in the example shown in FIGS. 10 to 17, the movement of the protector 1100 is not limited thereto. In an embodiment, the protector 1100 may be moved whenever a single substrate SUB has been processed, for example.

As described above, in the laser machining apparatus in the embodiment, the protector 1100 including a film having flexibility and laser transmittance may be driven in a roll-to-roll manner by the protector supplier 1200 and the protector retriever 1300 including the rolls. As the laser processing is carried out on the substrate SUB, the protector 1100 may collect particles P that are peeled off from the substrate SUB and fall onto one surface of the protector 1100, to form a pile of particles PL. When the particles P are sufficiently accumulated, the protector 1100 may move in the second direction DR2 by the protector driver PM while the substrate SUB is moved in the first direction DR1 by the substrate carrier CR and is replaced with the subsequent substrate SUB, so that the protector 1100 on which no pile of particles PL is formed may be fed in the process area PA in real time and continuously.

In this manner, the protector 1100 may be fed and retrieved to and from the processing chamber 1000 in real time and continuously, and thus no additional tray for replacing the protector 1100 is desired. Accordingly, it is possible to save time taken to replace a tray, and thus the loss of facility utilization may be significantly reduced. Moreover, there is no need for a separate device to replace the used protector 1100 with a new one until the protector 1100 wound around the feed roll 1400 is used out. Accordingly, it is easier to operate the apparatus.

Figure 18A:
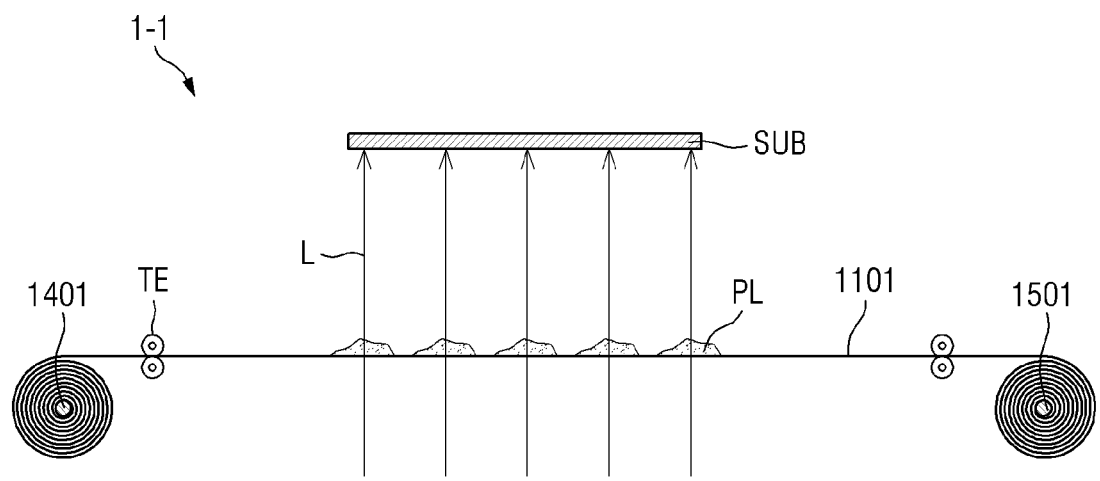
FIGS. 18A to 18C are cross-sectional views of another embodiment of a laser machining apparatus according to the invention.
Figure 18B:
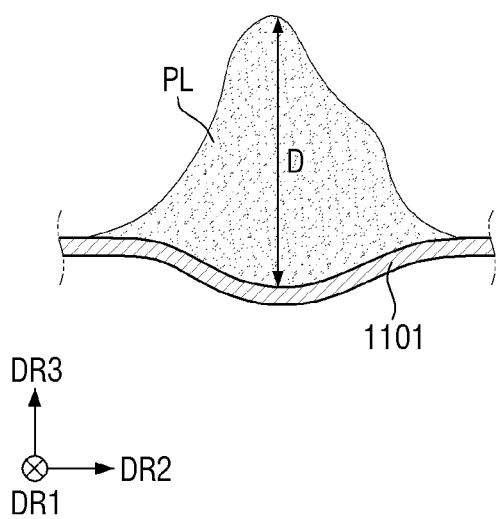
Figure 18C:
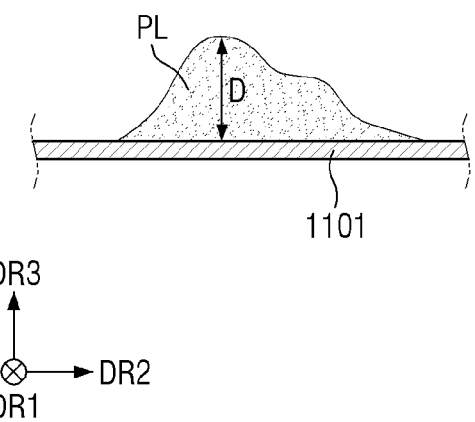

FIGS. 18A to 18C are cross-sectional views of another embodiment of a laser machining apparatus according to the invention.

The embodiment of FIGS. 18A to 18C is substantially identical to the embodiment of FIG. 7 except that laser machining apparatus 1-1 further includes a tension device, and therefore the redundant descriptions will be omitted.

Specifically, referring to FIG. 18A, tension devices TE may be disposed at both ends of a protector 1101 adjacent to a feed roll 1401 and a take-up roll 1501, respectively.

Referring to FIG. 18B, as the length of the protector 1101 increases, the protector 1101 may sag toward the laser irradiator LM (refer to FIG. 9), i.e., in the opposite direction of the third direction DR3 by its own weight. When this happens, one surface of the protector 1101 may be bent in a U-shape, and accordingly, the pile of particles PL may become thicker. The transmittance of the laser beam L is lowered as the path D through which the pile of particles P passes increases. Therefore, when the protector 1100 sags toward the laser irradiator LM and accordingly the particles P are accumulated more and more as in the example shown in FIG. 18B, the path D through which the laser beam L passes the pile of particles becomes longer, and thus the transmittance of the laser beam L may be further lowered.

In view of the above, referring to FIG. 18C, the tension devices TE may maintain the tension of the protector 1101. The tension devices may apply tension to the protector 1101 to prevent the protector 1101 from sagging toward the laser irradiator LM by its own weight. By doing so, the particles P peeled off from the substrate SUB cannot be accumulated overly on the surface of the protector 1101, and thus the path D through which the laser beam L passes the pile of particles becomes shorter. As a result, the transmittance of the laser beam L may be further improved.

Figure 19:
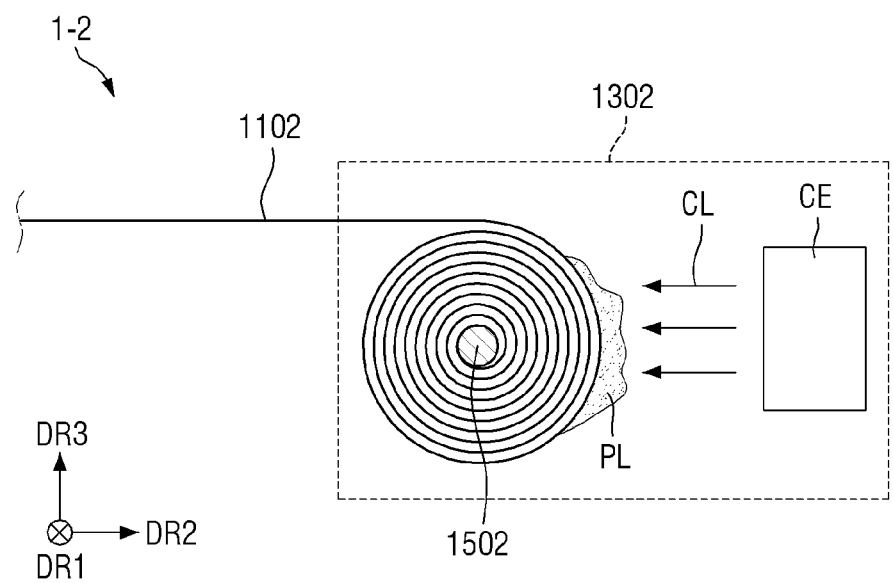
FIG. 19 is a cross-sectional view of another embodiment of a laser processing apparatus according to the invention.

FIG. 19 is a cross-sectional view of another embodiment of a laser machining apparatus in another embodiment of the invention.

The embodiment of FIG. 19 is substantially identical to the embodiment of FIG. 7 except that laser machining apparatus 1-2 further includes a cleaning device in a protector retriever, and therefore the redundant descriptions will be omitted.

Specifically, a cleaning device CE of the laser machining apparatus 1-2 in this embodiment may clean a protector 1102 retrieved in the protector retriever 1302.

As shown in FIG. 19, a pile of particles PL formed during laser processing may ride on the protector 1102 and retrieved by the protector retriever 1302. The pile of particles PL may be removed from the protector 1102 by the cleaning device CE. After the pile of particles has been removed, the protector 1102 may be wound around a take-up roll 1502 and stored in the protector retriever 1302. Accordingly, when the protector 1102 wound around the protector supplier 1200 (refer to FIG. 7) has been all unwound, the laser processing may be carried out by recycling the protector 1102 wound around the protector retriever 1302. In other words, when the protector 1102 wound around the protector supplier 1200 (refer to FIG. 7) is all unwound, in order to reuse the protector 1102 wound around the protector retriever, the take-up roll 1502 may rotate in a direction in which the protector 1102 wound around the take-up roll 1502 is unwound. At the same time, the feed roll 1400 (refer to FIG. 7) may rotate in the same rotational direction and at the same rotational speed as those of the take-up roll 1502. By doing so, the protector 1102 may be moved in the direction from the protector retriever 1302 to the protector supplier 1200 (refer to FIG. 7), i.e., in the opposite direction to the second direction DR2, and may be fed to the process area PA again. In this way, by regenerating the protector 1102, the replacement interval of the protector 1102 may be significantly increased.

In an embodiment, the cleaning device CE may use, but is not limited to, a carbon dioxide ($CO_2$) laser CL. When the cleaning device CE cleans using the carbon dioxide ($CO_2$) laser CL the protector 1102 on which the pile of particles PL is collected, cleaning may be carried out while maintaining the vacuum state of the processing chamber 1000 (refer to FIG. 7). As a result, it is possible to prevent deterioration of the substrate SUB.

Figure 20:
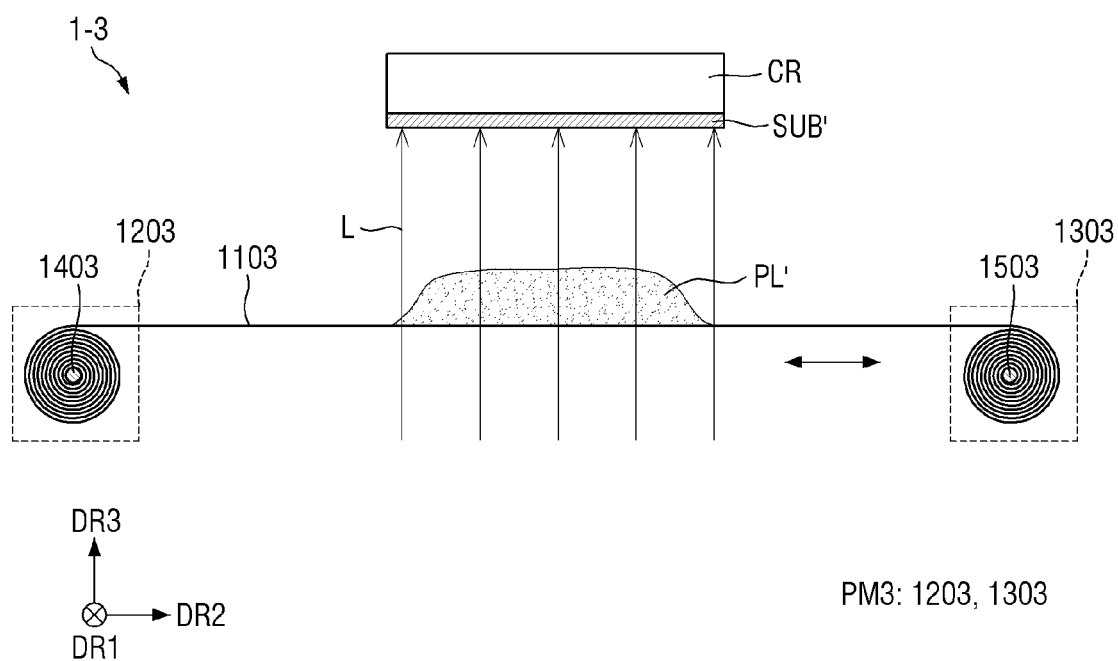
FIG. 20 is a cross-sectional view of another embodiment of a laser machining apparatus according to the invention.

FIG. 20 is a cross-sectional view of an embodiment of a laser machining apparatus according to the invention. FIGS. 21 to 26 are views showing the embodiment of the driving of the protector of FIG. 20 in the first mode and the second mode so that it reciprocates between the protector supplier and the protector retriever.

Although one laser beam L is shown in FIGS. 21 to 26 for convenience of illustration, the number of laser beams L is not limited thereto.

The embodiment of FIGS. 20 to 26 is substantially identical to the embodiment of FIG. 7 except that a protector may move back and forth between the protector supplier and the protector retriever during the laser processing in a laser machining apparatus 1-3, and therefore the redundant descriptions will be omitted.

Specifically, a protector driver PM3 in this embodiment may be driven in a first mode MD1 for moving the protector 1103 from the protector supplier 1203 including a feed roll 1403 to the protector retriever 1303 including a take-up roll 1503, and in a second mode MD2 for moving the protector 1103 from the protector retriever 1303 to the protector supplier 1203. Particles P (refer to FIGS. 23 and 25) that are peeled off from the substrate SUB' may form a pile of particles PL' as shown in FIG. 20.

Figure 21:
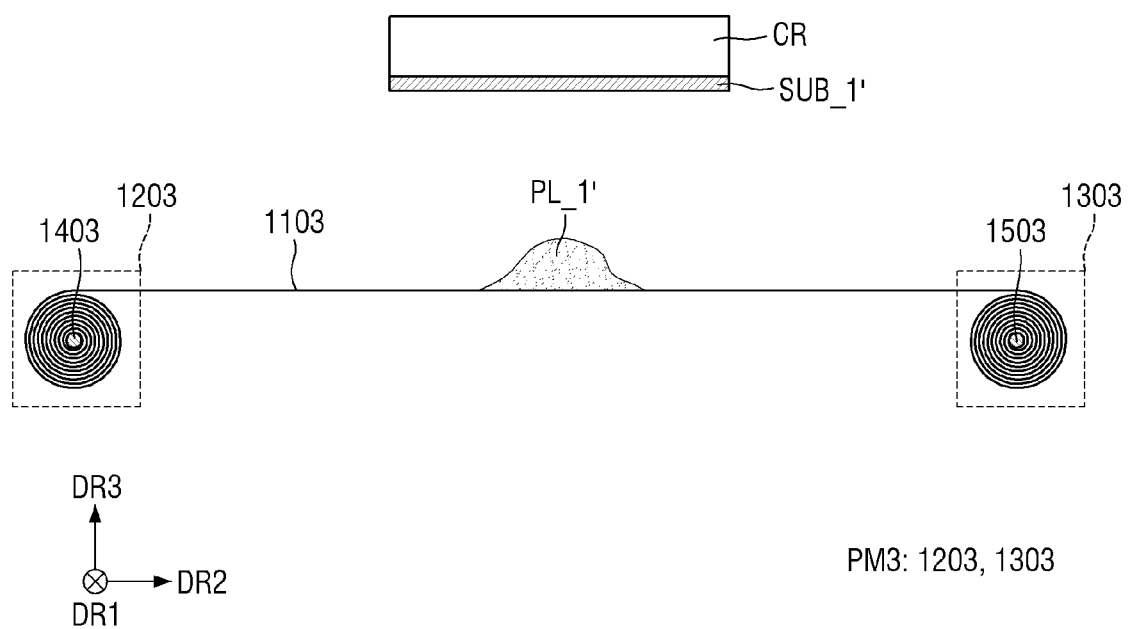
FIGS. 21 to 26 are views showing the driving of the protector in the embodiment of FIG. 20 in the first mode and the second mode so that it reciprocates between the protector supplier and the protector retriever.

Specifically, during the process of irradiating a laser onto a substrate SUB_1' to process the substrate SUB_1', a first pile of particles PL_1' may be formed on the protector 1103, as shown in FIG. 21.

Figure 22:
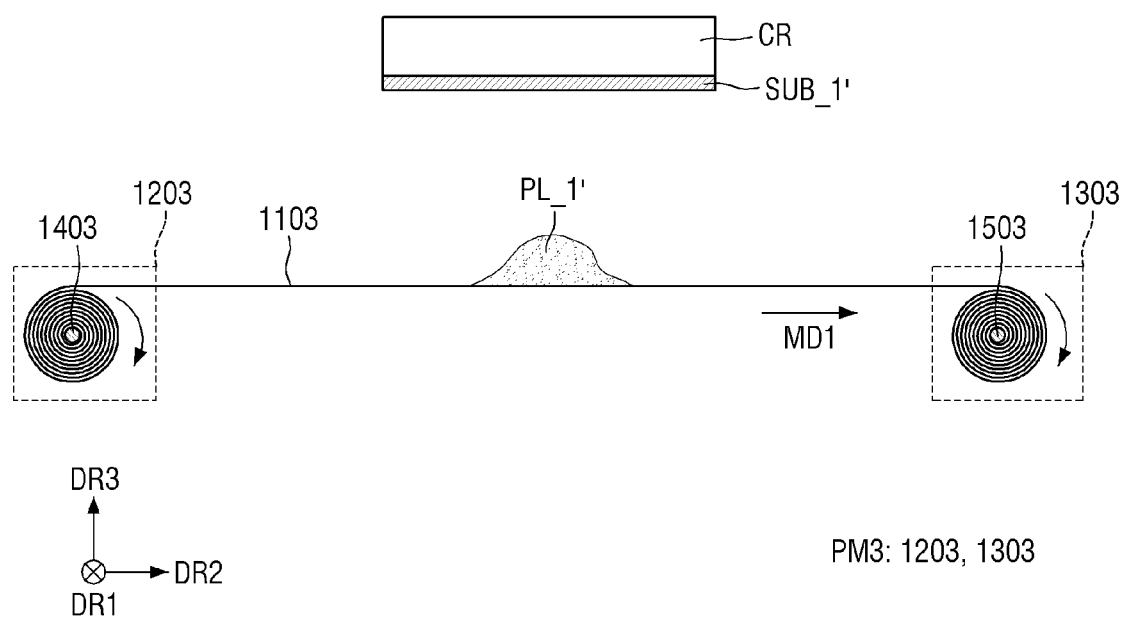

Subsequently, while the substrate SUB_1' is moved out of a process area PA and replaced with the subsequent substrate SUB_2', and the subsequent substrate SUB_2' is provided in the process area PA, the protector driver PM3 may be driven in the first mode MD1 in which the protector 1103 is moved in the second direction DR2 as shown in FIG. 22.

Figure 23:
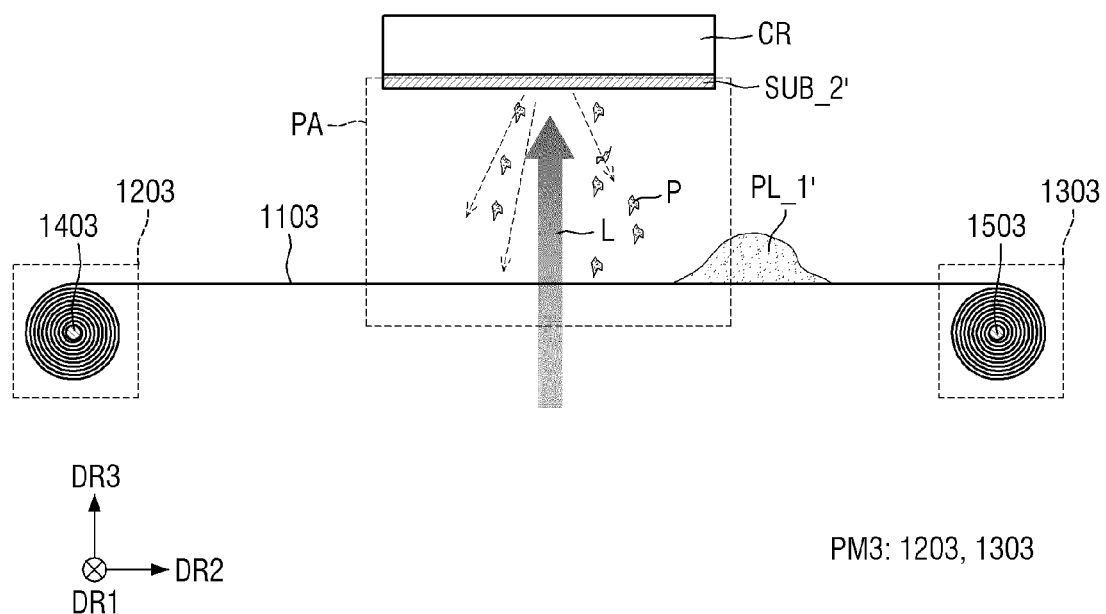

In this instance, as shown in FIG. 23, the particles P are hardly accumulated on the surface of the protector 1103 overlapping the process area PA, so that the laser beam L irradiated from the laser irradiator LM may reach the subsequent substrate SUB_2' without being weakened. As a result, the processing efficiency may be increased.

Figure 24:
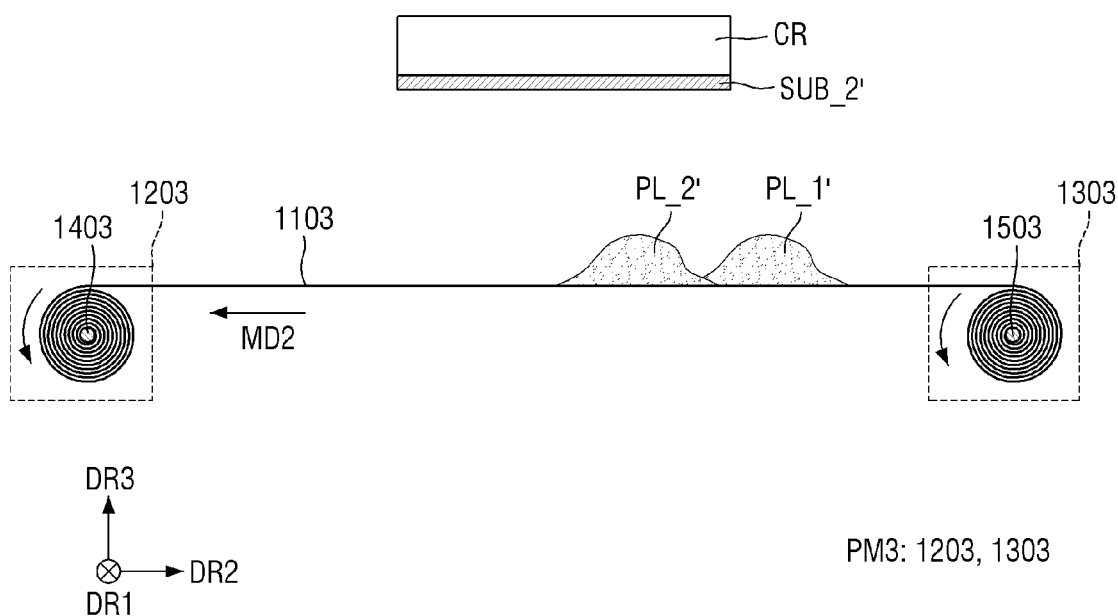
Figure 25:
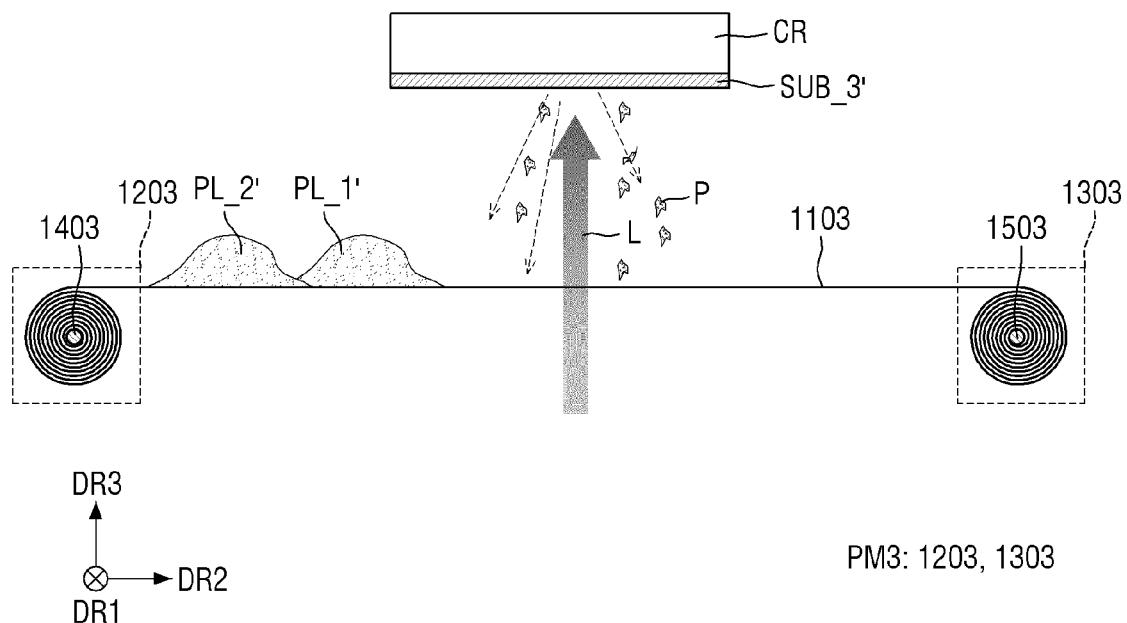

Subsequently, as shown in FIG. 23, laser processing may be carried out on the subsequent substrate SUB_2', and accordingly a second pile of particles PL_2' may be formed on the protector 1103. In addition, while the subsequent substrate SUB_2' is replaced with the next substrate SUB_3', the protector driver PM3 may be driven in the second mode MD2 in which the protector 1103 is moved in the direction opposite to the second direction DR2 as shown in FIG. 24.

In this instance, particles P are hardly accumulated on the surface of the protector 1103 through which the laser beam L passes, so that the laser beam L may reach the next substrate SUB_3' without the intensity being lowered, and thus the processing efficiency may be increased.

Figure 26:
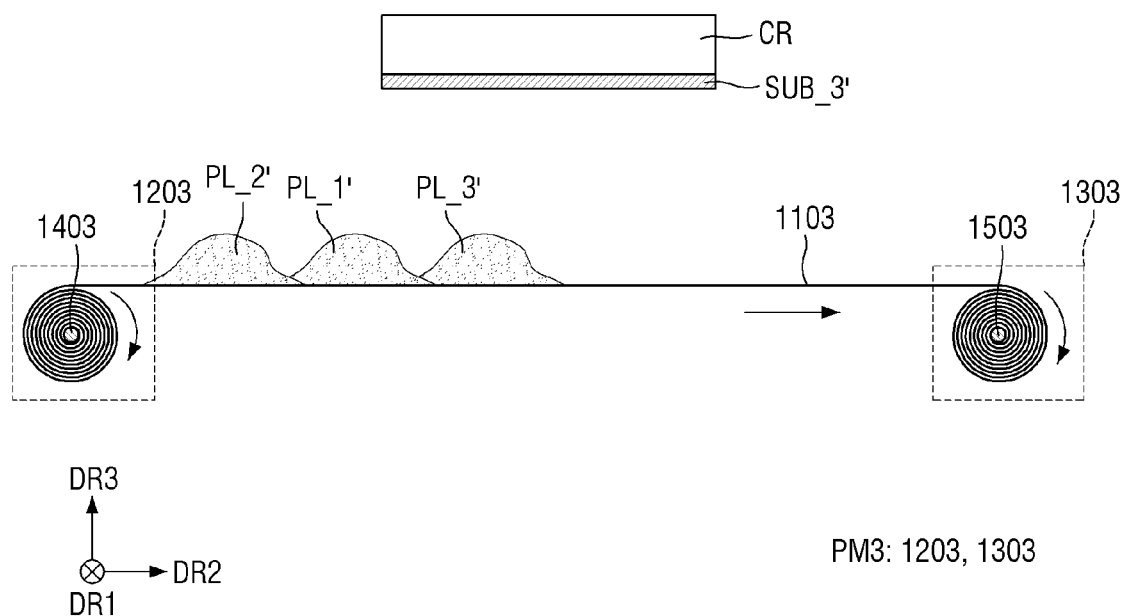

Subsequently, as shown in FIG. 26, laser processing may be carried out on the subsequent substrate SUB_3', and accordingly a third pile of particles PL_3' may be formed on the protector 1103. In addition, while the subsequent substrate SUB_3' is replaced with another substrate SUB_n' (refer to FIG. 28), the protector driver PM3 operates in the first mode and thus the protector 1103 moves in the second direction DR2, such that the first pile of particles PL_1' may be returned to the position (refer to FIG. 22) where it was disposed before the protector 1103 was driven. Then, when the subsequent substrate SUB_3' is replaced with another substrate SUB_n', the laser irradiator LM performs laser processing on the substrate SUB_n' and repeats the processes of FIGS. 21 to 26.

Figure 27:
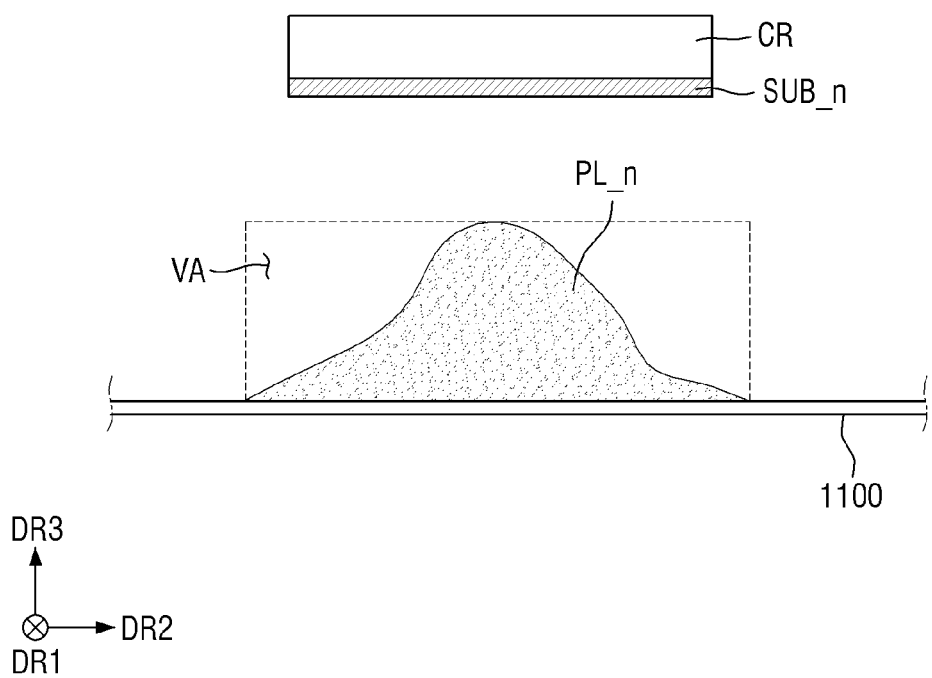
FIG. 27 is a cross-sectional view showing a pile of particles in the embodiment of FIG. 7.
Figure 28:
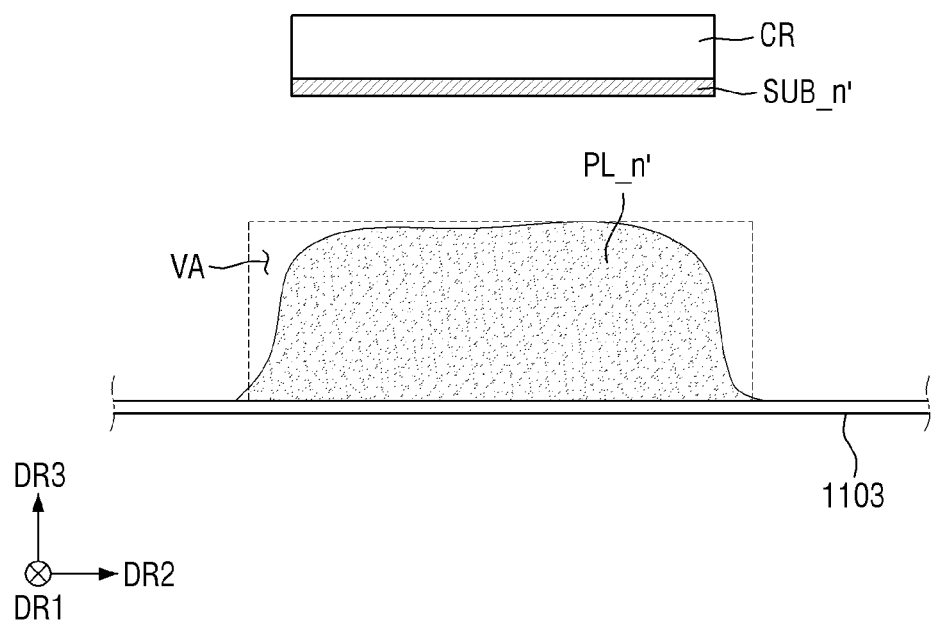
FIG. 28 is a cross-sectional view showing a pile of particles in the embodiment of FIG. 20.

FIG. 27 is a cross-sectional view showing a pile of particles in the embodiment of FIG. 7. FIG. 28 is a cross-sectional view showing a pile of particles in the embodiment of FIG. 20.

Referring to FIG. 27, there may be a large space VA in which particles do not exist between a surface passing through the highest point of the pile of particles PL_n in the embodiment of FIG. 7 and one surface of the protector 1100.

Referring to FIG. 28, there may be a small space VA in which particles do not exist between a surface passing through the highest point of the pile of particles PL_n in the embodiment of FIG. 20 and one surface of the protector 1103.

Referring to FIGS. 27 and 28, more particles may be accommodated on the surface of the protector 1103 in the embodiment of FIG. 20, and thus it is desired to clean or replace the protector 1103 less frequently.

Figure 29:
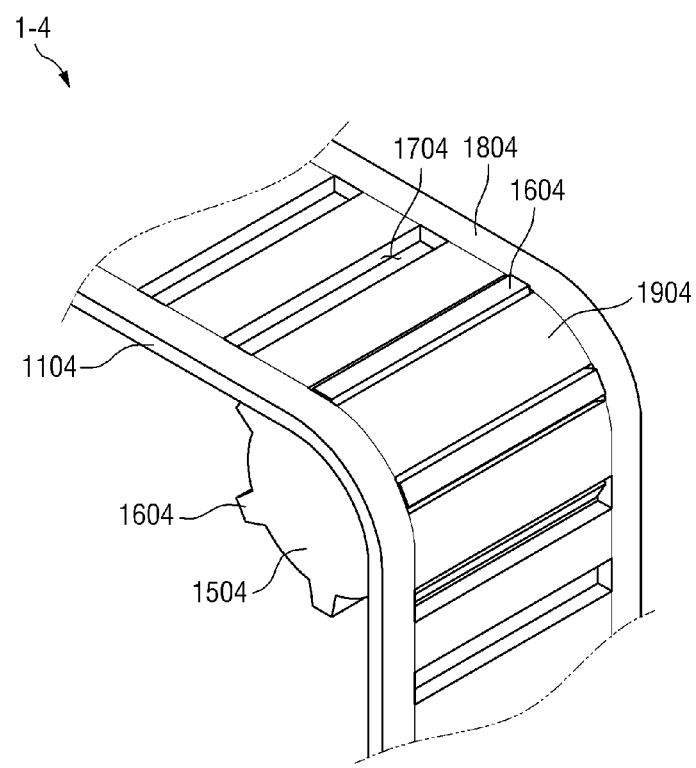
FIGS. 29 to 31 are perspective views of another embodiment of a laser machining apparatus.
Figure 30:
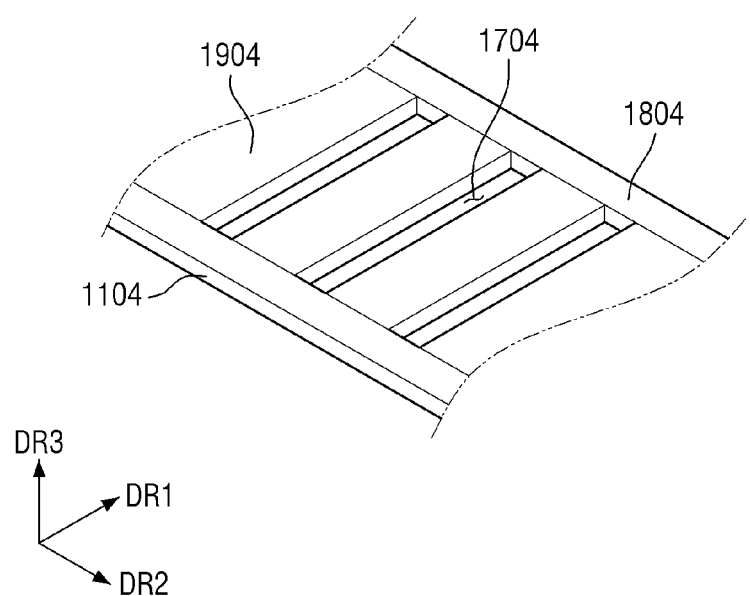
Figure 31:
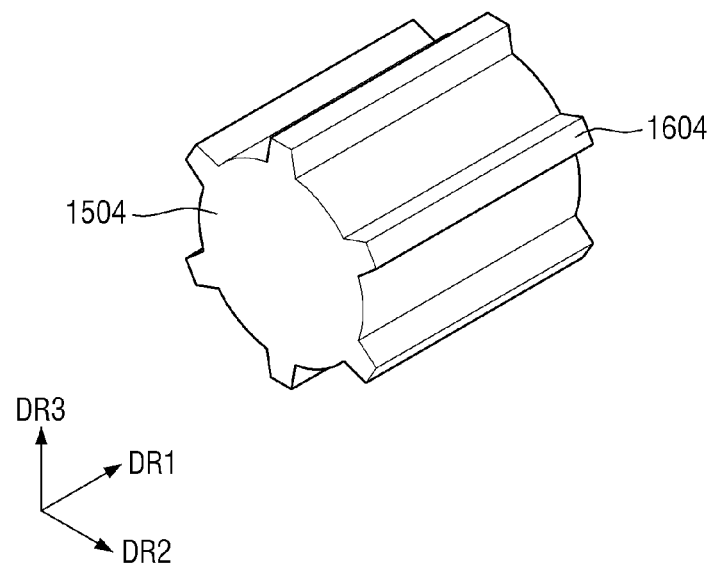

FIGS. 29 to 31 are perspective views of another embodiment of a laser machining apparatus.

The embodiment of FIGS. 29 to 31 is substantially identical to the embodiment of FIG. 7 except that each of a feed roll and a take-up roll of a laser machining apparatus 1-4 further includes protrusions, and a protector of the laser machining apparatus 1-4 further includes grooves, and therefore the redundant descriptions will be omitted.

Specifically, each of the feed roll (not shown) and the take-up roll 1504 of the laser machining apparatus 1-4 in this embodiment may further include protrusions 1604. The protector 1104 may further include protection portions 1904 spaced apart from one another, grooves 1704 each defined as a gap between the protection portions 1904, and a peripheral portion 1804 connecting between the plurality of protection portions 1904. Although only the take-up roll 1504 is depicted in FIGS. 29 to 31, the take-up roll 1504 and the feed roll may have the same shape.

Particles P peeled off from the substrate SUB may be collected by the plurality of protection portions 1904 and the peripheral portion 1804 of the protector 1104, and the protrusions of the feed roll and the take-up roll 1504 may fit into the grooves 1704 of the protector 1104. As the grooves of the protector 1104 are engaged with the protrusions 1604 of the feed roll and the take-up roll 1504, it is possible to effectively prevent the protector 1104 deviates from the feed roll and the take-up roll 1504. Although FIGS. 29 to 31 show the grooves 1704 in the quadrangular (e.g., rectangular) shape, but the invention is not limited thereto. They may include grooves in a circular shape.

Figure 32:
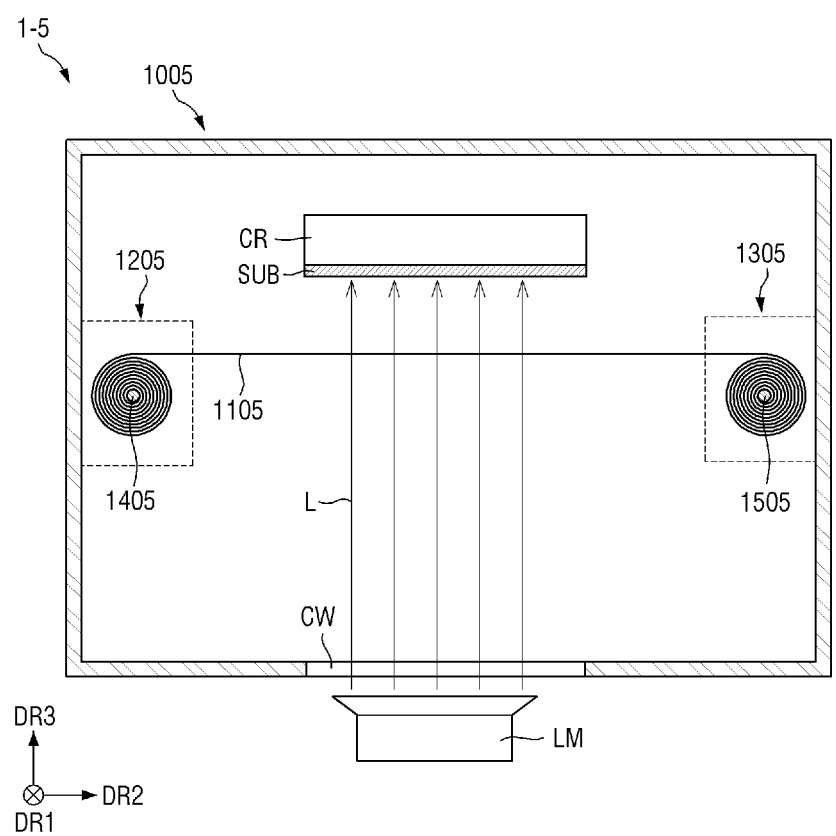
FIG. 32 is a cross-sectional view of another embodiment of a laser processing apparatus according to the invention.

FIG. 32 is a cross-sectional view of another embodiment of a laser machining apparatus in according to the invention.

The embodiment of FIG. 32 is substantially identical to the embodiment of FIG. 7 except that a laser machining apparatus 1-5 may include a protector supplier and a protector retriever in a processing chamber, and therefore the redundant descriptions will be omitted.

Specifically, the protector supplier 1205 including a feed roll 1405 and the protector retriever 1305 including a take-up roll 1505 in this embodiment may be disposed inside the processing chamber 1005 rather than being disposed outside the processing chamber 1005 to protrude therefrom. In other words, the entire protector 1105 may be disposed inside the processing chamber. In this instance, no additional chamber is desired outside the processing chamber 1005, and thus the laser machining apparatus may be more easily implemented.

Figure 33:
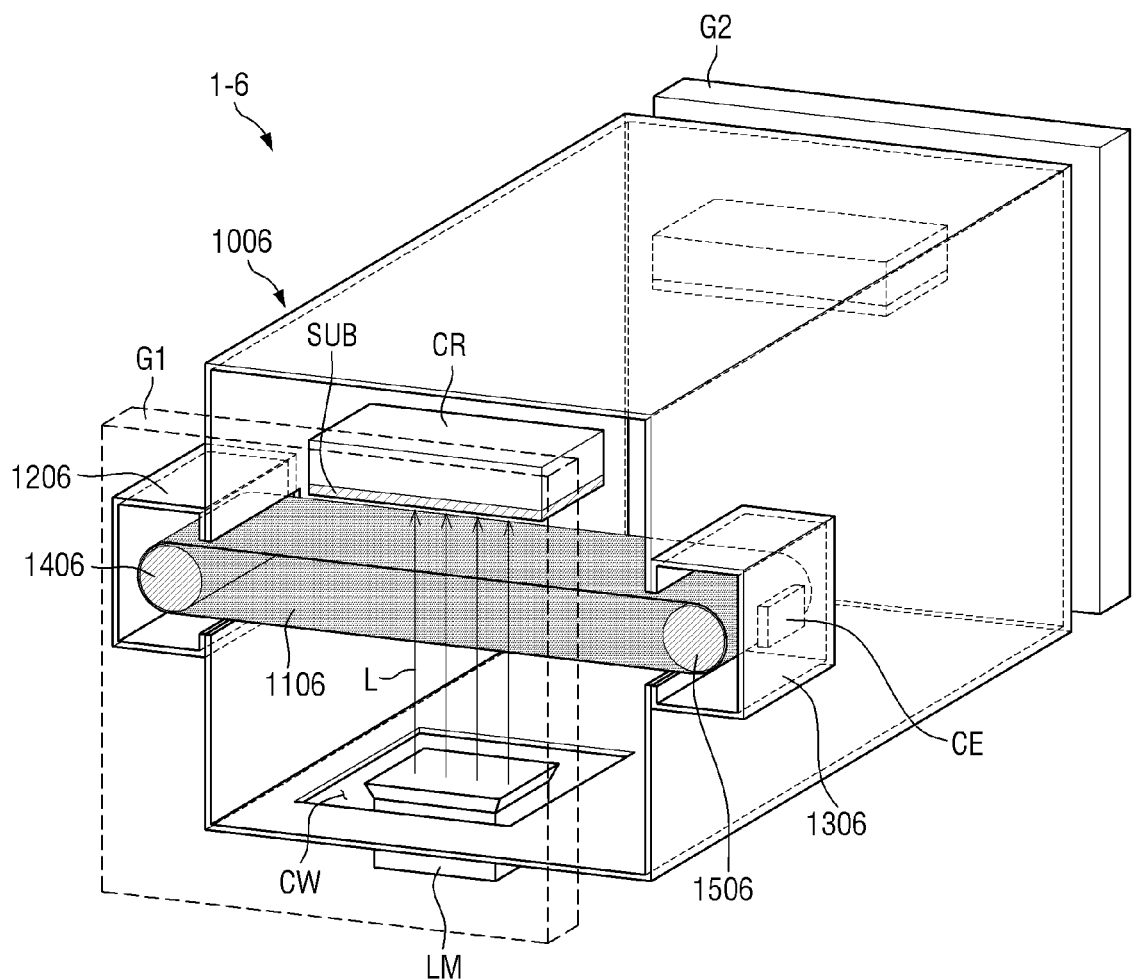
FIG. 33 is a perspective view of another embodiment of a laser processing apparatus according to the invention.
Figure 34:
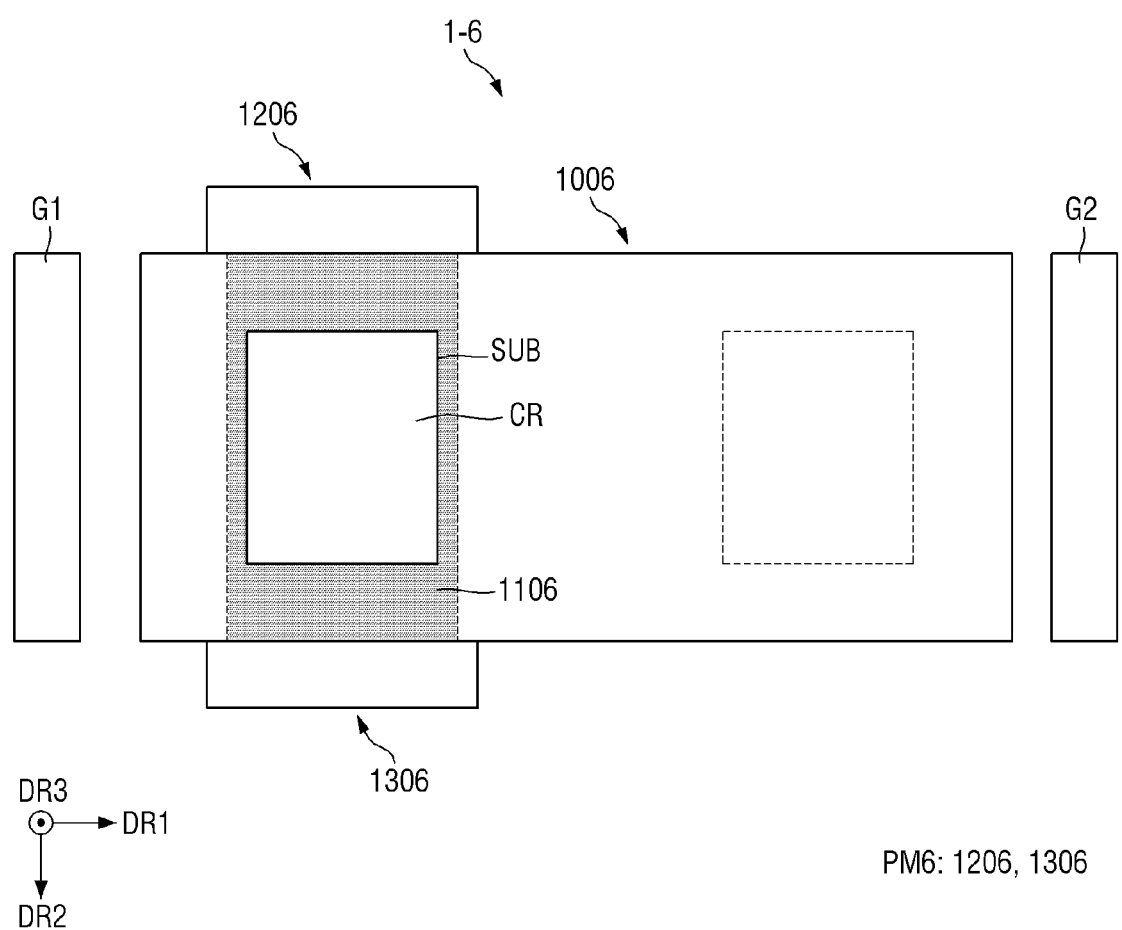
FIG. 34 is a plan view of the laser machining apparatus in the embodiment of FIG. 33 when viewed in the third direction DR3.
Figure 35:
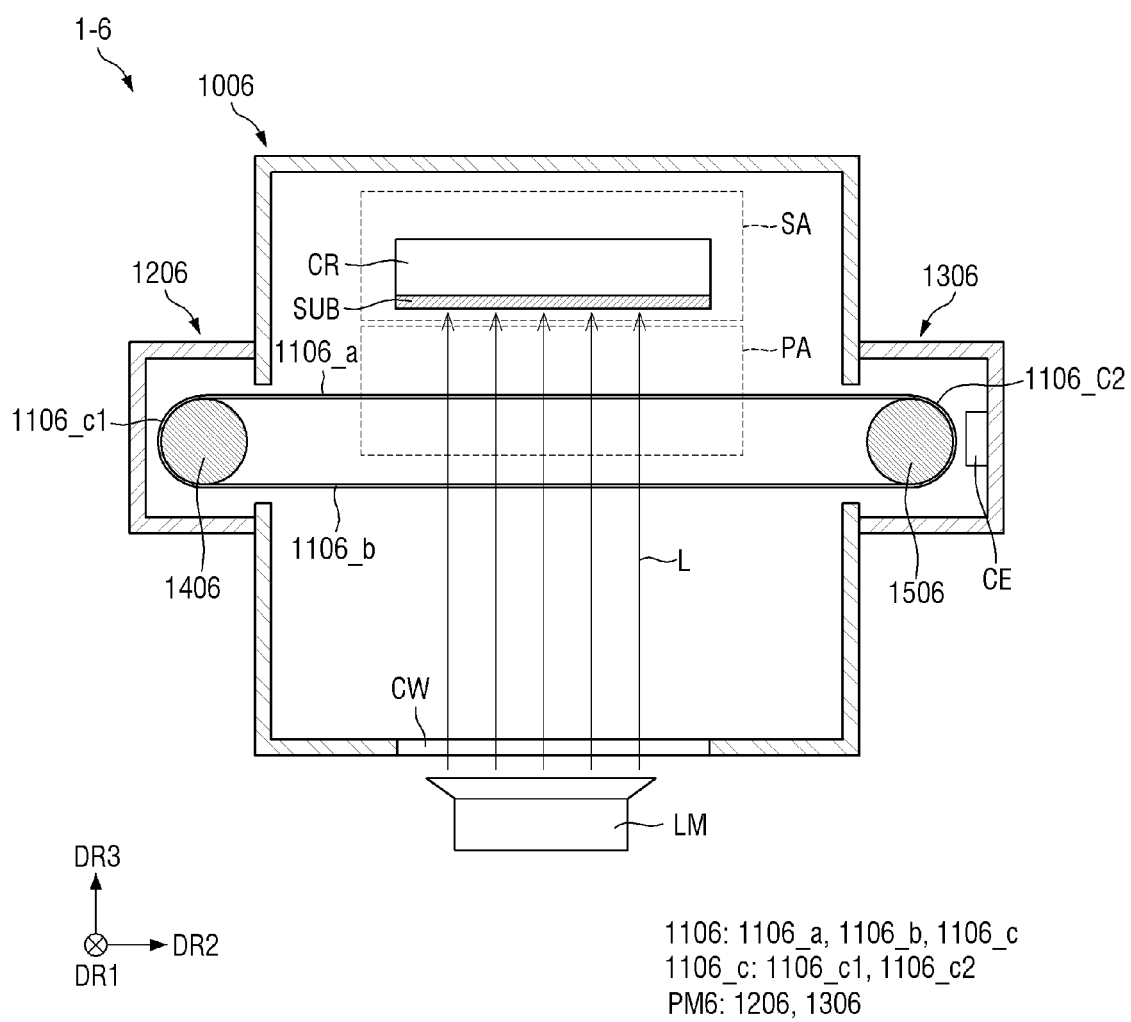
FIG. 35 is a cross-sectional view of the laser machining apparatus in the embodiment of FIG. 33 when viewed in the first direction DR1.

FIG. 33 is a perspective view of another embodiment of a laser machining apparatus according to the invention. FIG. 34 is a plan view of the embodiment of the laser machining apparatus of FIG. 33 when viewed in the third direction DR3. FIG. 35 is a cross-sectional view of the embodiment of the laser machining apparatus of FIG. 33 when viewed in the first direction DR1.

The embodiment of FIG. 33 is substantially identical to the embodiment of FIG. 7 except that a protector of a laser machining apparatus 1-6 includes a protector driver PM6 that defines a closed loop and is implemented as a caterpillar track, and that a cleaning device further included in a protector retriever, and therefore the redundant descriptions will be omitted.

As shown in FIGS. 33 to 35, a protector driver PM6 may include a protector supplier 1206 and a protector retriever 1306, and the protector 1106 may define a closed loop.

The protector 1106 may be disposed above the chamber window CW in the processing chamber 1006. In addition, the protector 1106 may be disposed between the substrate carrier CR (or the substrate SUB) and the chamber window CW in the processing chamber 1006. That is to say, at least a portion of the protector 1106 may be disposed such that it traverses the process area PA where the substrate carrier CR (or the substrate SUB) and the chamber window CW overlap each other.

As shown in FIG. 35, the width of the protector 1106 parallel to the first direction DR1 or the second direction DR2 may be larger than the width of the substrate SUB parallel to the first direction DR1 or the second direction DR2. That is to say, the substrate may completely overlap the protector in the third direction DR3. Accordingly, it is possible to prevent particles that are peeled off from the substrate SUB during the laser processing from passing through the protector 1106 and falling onto the chamber window CW.

The width of each of the protector supplier 1206 and the protector retriever 1306 may be larger than the width of the protector 1106, as shown in FIG. 35. In the example shown in FIGS. 33 to 35, the protector supplier 1206 and the protector recovery module 1306 have the same width and height and thus the same volume. It should be understood, however, that the width or height of each of the protector supplier 1206 and the protector recovery module 1306 is not limited thereto. In addition, as shown in FIGS. 33 and 34, the protector supplier 1206 and the protector recovery module 1306 may be disposed outside the processing chamber 1006 between the substrate carrier CR and the laser irradiator LM in the third direction DR3. It should be understood, however, that the invention is not limited thereto.

The protector supplier 1206 may be disposed outside the processing chamber 1006 on the left side of the processing chamber 1006. A space in which the protector 1106 is stored may be defined in the protector supplier 1206. The protector supplier 1206 may include a feed roll 1406. The opposite surface of the protector 1106 may engage with the feed roll 1406.

The protector retriever 1306 may be disposed outside the processing chamber 1006 on the right side of the processing chamber 1006. A space in which the protector 1106 collecting particles peeled off from the substrate SUB is retrieved may be defined in the protector retriever 1306. The protector retriever 1306 may include a take-up roll 1506. The opposite surface of the protector 1106 may engage with the take-up roll 1506.

Referring to FIGS. 33 and 34, the protector 1106 may be extended from the protector supplier 1206 to the protector retriever 1306, and may be extended from the protector retriever 1306 to the protector supplier 1206. Specifically, the protector 1106 may define a closed loop such that it is not wound around the feed roll 1406 or the take-up roll 1506 but may be engaged with the feed roll 1406 and the take-up roll 1506. As shown in FIG. 35, the protector 1106 may include a protector supplying portion 1106_a engaging with the upper portion of the feed roll 1406 and the upper portion of the take-up roll 1506 and extended from the protector supplier 1206 to the protector retriever 1306, a protector retrieving portion 1106_b engaging with the lower portion of the take-up roll 1506 and the lower portion of the feed roll 1406 and extended from the protector retriever 1306 to the protector supplier 1206, and protector connecting portions 1106_c connecting the protector supplying portion 1106_a with the protector retrieving portion 1106_b where the protector 1106 engages with the side surface of the feed roll 1406 and the side surface of the take-up roll 1506. In addition, the protector connecting portions 1106_c may include a first connecting portion 1106_c1 connecting the protector supplying portion 1106_a with the protector retrieving portion 1106_b where the protector 1106 and the feed roll 1406 are engaged with each other, and a second connecting portion 1106_c2 connecting the protector supplying portion 1106_a with the protector retrieving portion 1106_b where the protector 1106 and the take-up roll 1506 are engaged with each other. The protector supplying portion 1106_a may pass through the process area PA, and the protector retrieving portion 1106_b may not pass through the process area PA. The distance between the protector supplying portion 1106_a and the substrate SUB in the third direction DR3 may be smaller than the distance between the protector retrieving portion 1106_b and the substrate SUB.

A cleaning device CE disposed in the protector retriever 1306 may remove a pile of particles on one surface of the protector connecting portions 1106_c retrieved from the processing chamber 1006. In an embodiment, the cleaning device CE may be, but is not limited to, a cleaning device using a carbon dioxide ($CO_2$) laser. When the cleaning device CE cleans using the carbon dioxide ($CO_2$) laser the protector 1106 on which the pile of particles is collected, cleaning may be carried out while maintaining the vacuum state of the processing chamber 1000. As a result, it is possible to prevent deterioration of the substrate SUB. The pile of particles PL removed by the cleaning device CE may come off the protector 1106 and fall onto the protector retriever 1306. Accordingly, agate for removing the pile of particles coming off from the protector 1106 may be further included in the protector retriever 1306.

When laser processing is carried out in the processing chamber 1006, the protector supplying portion 1106_a of the protector 1106 engaging with the feed roll 1406 rotates in the direction in which it moves to the processing chamber 1006, i.e., in the second direction DR2, so that the protector 1106 may be fed into the processing chamber 1006 in real time and continuously.

As the laser processing proceeds in the processing chamber 1006, the take-up roll 1506 rotates with the feed roll 1406 at the same rotational speed and in the same rotational direction as those of the feed roll 1406, so that the protector 1106 collecting the particles peeled off from the substrate SUB may be retrieved in the protector retriever 1306 in real time.

After particles are removed from the protector 1106 by the cleaning device CE disposed in the protector retriever 1306, the take-up roll 1506 rotates with the feed roll 1406 at the same rotational speed and in the same rotational direction as those of the feed roll 1406, so that the protector 1106 may move again in the direction from the protector retriever 1306 to the protector supplier 1206 through the processing chamber 1006, i.e., in the opposite direction to the second direction DR2.

Accordingly, the protector 1106 may be operated like a caterpillar track and may circulate in the processing chamber 1006. One surface of the protector 1106 may face the outer side of the track of the protector 1106. Specifically, one surface of the protector 1106 may face the substrate SUB when the protector 1106 moves from the protector supplier 1206 to the protector retriever 1306 through the processing chamber 1006, and may face the laser irradiator LM when it is retrieved again by the protector supplier 1206 from the protector retriever 1306 through the processing chamber 1006. The opposite surface of the protector 1106 may face the inner side of the track of the protector 1106. Specifically, the opposite surface of the protector 1106 may face the laser irradiator LM when the protector 1106 moves from the protector supplier 1206 to the protector retriever 1306 through the processing chamber 1006, and may face the substrate SUB when it is retrieved again by the protector supplier 1206 from the protector retriever 1306 through the processing chamber 1006. In addition, as the protector 1106 is circulated by the feed roll 1406 and the take-up roll 1506, the protector supplying portion 1106_*a*, the protector retrieving portion 1106_*b* and the protector connecting portions 1106_*c* may vary from time to time on the surface of the protector 1106.

As shown in FIGS. 33 to 35, the protector 1106 may move in the second direction DR2 inside the processing chamber 1006 by the protector supplier 1206 and the protector retriever 1306 disposed on the left and right sides of the processing chamber 1006, respectively. That is to say, the protector 1106 may move in the second direction DR2 different from the first direction DR1 in which the substrate SUB moves by the substrate carrier CR inside the processing chamber 1000. Since the processing chamber 1006 includes the longer sides in the first direction DR1 and the shorter sides in the second direction DR2 and the third direction DR3, the traveling distance of the protector 1106 is shorter than the traveling distance of the substrate SUB moving along the longer sides of the processing chamber 1006. Accordingly, the apparatus may be implemented easily, and power consumption for moving the protector 1106 may be saved.

As described above, the length of the protector 1106 in the laser machining apparatus in the embodiment of FIGS. 33 to 35 may be reduced, and thus the cost of fabricating the apparatus may be saved. Since the protector 1106 from which a pile of particles has been removed by the cleaning device CE may be infinitely regenerated in the protector supplier 1206, the replacement cycle of the protector 1106 may be significantly increased.

Figure 36:
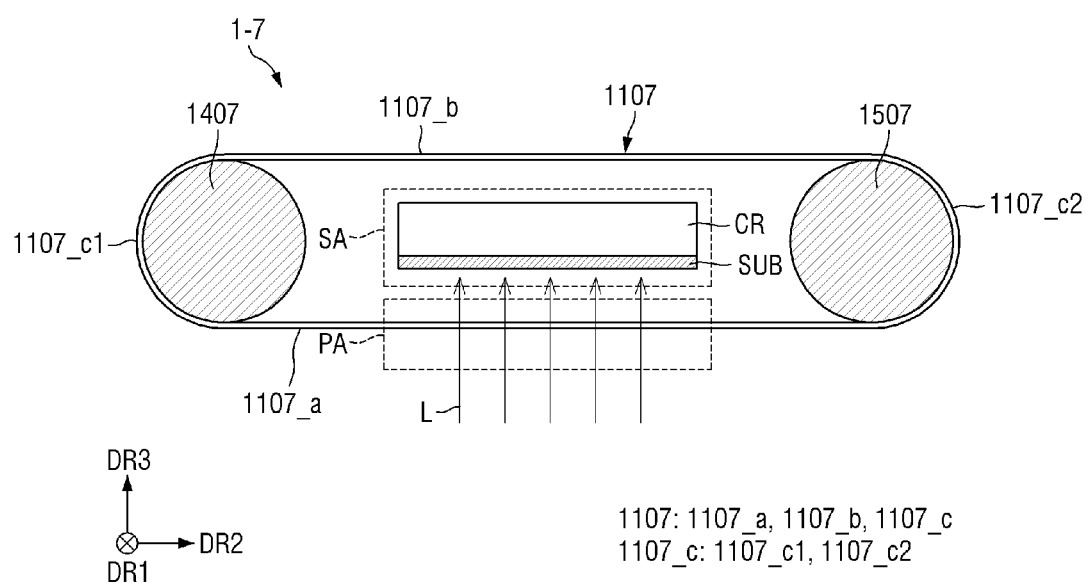
FIG. 36 is a cross-sectional view of another embodiment of a laser machining apparatus according to the invention.

FIG. 36 is a cross-sectional view of another embodiment of a laser machining apparatus according to the invention.

The embodiment of FIG. 36 is substantially identical to the embodiment of FIG. 33 except that a substrate carrier and a substrate are disposed between a track of a protector in a laser machining apparatus 1-7, and therefore the redundant descriptions will be omitted.

Specifically, in this embodiment of the invention, the protector 1107 may be extended from the protector supplier (not shown) to the protector retriever (not shown), and may be extended again from the protector retriever to the protector supplier. Specifically, the protector 1107 may define a closed loop such that it is not wound around the feed roll 1407 or the take-up roll 1507 but may be engaged with the feed roll 1407 and the take-up roll 1507. As shown in FIG. 36, the protector 1107 may include a protector supplying portion 1107_*a* engaging with the lower portion of the feed roll 1407 and the lower portion of the take-up roll 1507 and extended from the protector supplier to the protector retriever, a protector retrieving portion 1107_*b* engaging with the upper portion of the take-up roll 1507 and the upper portion of the feed roll 1407 and extended from the protector retriever to the protector supplier, and protector connecting portions 1107_*c* connecting the protector supplying portion 1107_*a* with the protector retrieving portion 1107_*b* where the protector 1107 engages with the side surface of the feed roll 1407 and the side surface of the take-up roll 1507. In addition, the protector connecting portions 1107_*c* may include a first connecting portion 1107_*c*1 connecting the protector supplying portion 1107_*a* with the protector retrieving portion 1107_*b* where the protector 1107 and the feed roll 1407 are engaged with each other, and a second connecting portion 1107_*c*2 connecting the protector supplying portion 1107_*a* with the protector retrieving portion 1107_*b* where the protector 1107 and the take-up roll 1507 are engaged with each other. The protector supplying portion 1107_*a* may pass through the process area PA, and the protector retrieving portion 1107_*b* may not pass through the process area PA.

As shown in FIG. 36, a substrate carrier CR and a substrate SUB may be disposed between the protector supplying portion 1107_*a* and the protector retrieving portion 1107_*b* in a processing chamber (not shown). In addition, the diameter of the feed roll 1407 and the take-up roll 1507 may be larger than the sum of the height of the substrate carrier CR and the height of the substrate SUB. Accordingly, the laser beam L irradiated from the laser irradiator LM may pass through only the protector supplying portion 1107_*a* of the protector 1107. Therefore, the laser machining apparatus in this embodiment may prevent a decrease in transmittance of the laser beam L.

Referring back to FIG. 36, the protector 1107 may collect particles peeled off from the substrate SUB on one surface of the protector supplying portion 1107_*a* in the process area PA, and one surface of the protector connecting portions 1107_*c* may engage with the feed roll 1407 and the take-up roll 1507 in the protector supplier and the protector retriever. Accordingly, the cleaning device CE of the protector retriever may be disposed where the protector supplying portion 1107_*a* does not overlap the process area PA, and may remove a pile of particles collected on the protector supplying portion 1107_*a*.

Figure 37:
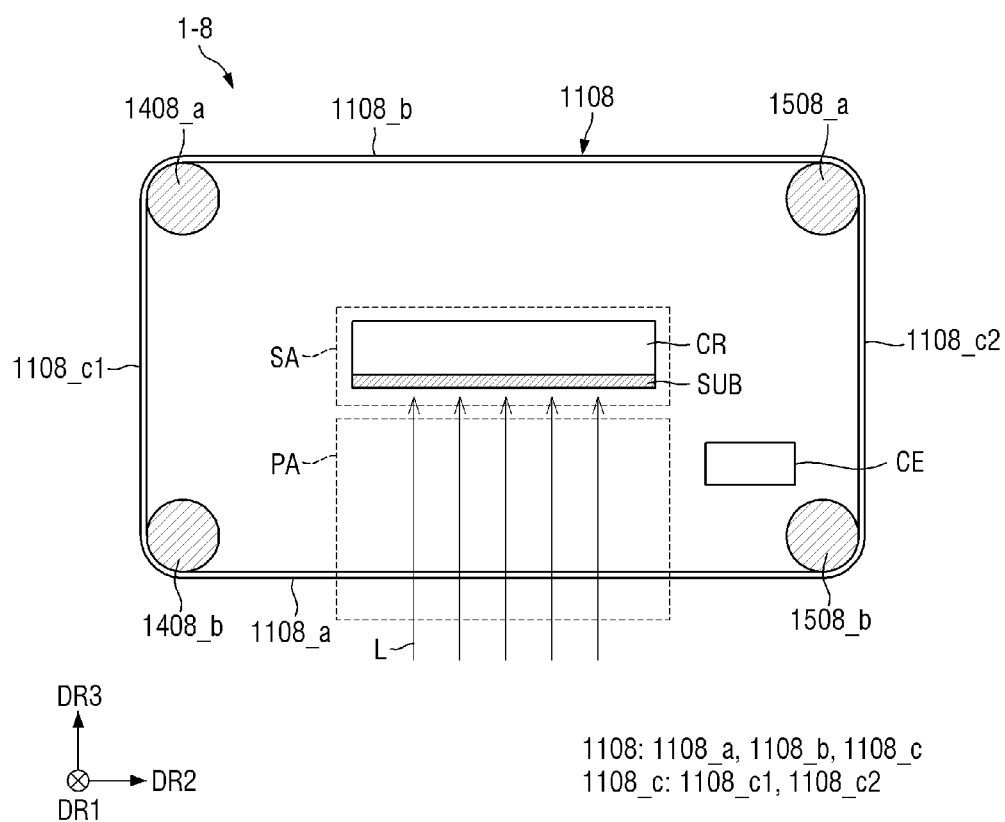
FIG. 37 is a cross-sectional view of another embodiment of a laser machining apparatus according to the invention.

FIG. 37 is a cross-sectional view of another embodiment of a laser machining apparatus according to the invention.

The embodiment of FIG. 37 is substantially identical to the embodiment of FIG. 36 except that the number of feed rolls and take-up rolls forming a track of a protector in a laser machining apparatus 1-8 may be increased, and therefore the redundant descriptions will be omitted.

Specifically, FIG. 37 shows two feed rolls and two take-up rolls, but the number of the feed rolls and the take-up rolls is not limited thereto.

As shown in FIG. 37, the feed rolls may include an upper feed roll 1408_*a* and a lower feed roll 1408_*b*, and the take-up rolls may include an upper take-up roll 1508_*a* and a lower take-up roll 1508_*b*. As the number of the feed rolls and the take-up rolls increases, the diameters of the feed rolls and the take-up rolls are reduced, and accordingly the area of the protector 1108 engaged with the feed rolls and the take-up rolls may be reduced. As a result, the volume of the protector supplier (not shown) and the protector retriever (not shown) may be reduced, and accordingly friction between the protector 1108 and the feed rolls and the take-up rolls may be reduced, thereby reducing power consumption.

The protector 1108 of the laser machining apparatus 1-8 in this embodiment may include a protector supplying portion 1108_*a* extended from the lower feed roll 1408_*b* to the lower take-up roll 1508_*b*, a protector retrieving portion 1108_*b* extended from the upper take-up roll 1508_*a* to the upper feed roll 1408_*a*, and protector connecting portions 1108_*c* connecting the protector supplying portion 1108_*a* with the protector retrieving portion 1108_*b* in the protector supplier and the protector retriever. The protector connecting portions 1108_*c* may include a first connecting portion 1108_*c*1 extended from the upper feed roll 1408_*a* to the lower feed roll 1408_*b* and a second connecting portion 1108_*c*2 extended from the lower take-up roll 1508_*b* to the upper take-up roll 1508_*a*. The protector supplying portion 1108_*a* may pass through the process area PA, and the protector retrieving portion 1108_*b* may not pass through the process area PA. The distance between the protector supplying portion 1108_*a* and the substrate SUB in the third direction DR3 may be smaller than the distance between the protector retrieving portion 1108_b and the substrate SUB.

Accordingly, in this embodiment, the length of the second connecting portion 1108_c2 of the protector connecting portions 1108_c is increased, and thus the cleaning area of the cleaning device CE is increased, so that it is possible to more reliably remove a pile of particles accumulated on the second connecting portion 1108_c2 of the protector connecting portions 1108_c.

As shown in FIG. 37, the substrate carrier CR and the substrate SUB may be disposed between the protector supplying portion 1108_a and the protector retrieving portion 1108_b in the processing chamber 1000 (refer to FIG. 7). Accordingly, the laser beam L irradiated from the laser irradiator LM may pass through only the protector supplying portion 1108_a of the protector 1108. Therefore, the laser machining apparatus in this embodiment may prevent a decrease in transmittance of the laser beam L.

Figure 38:
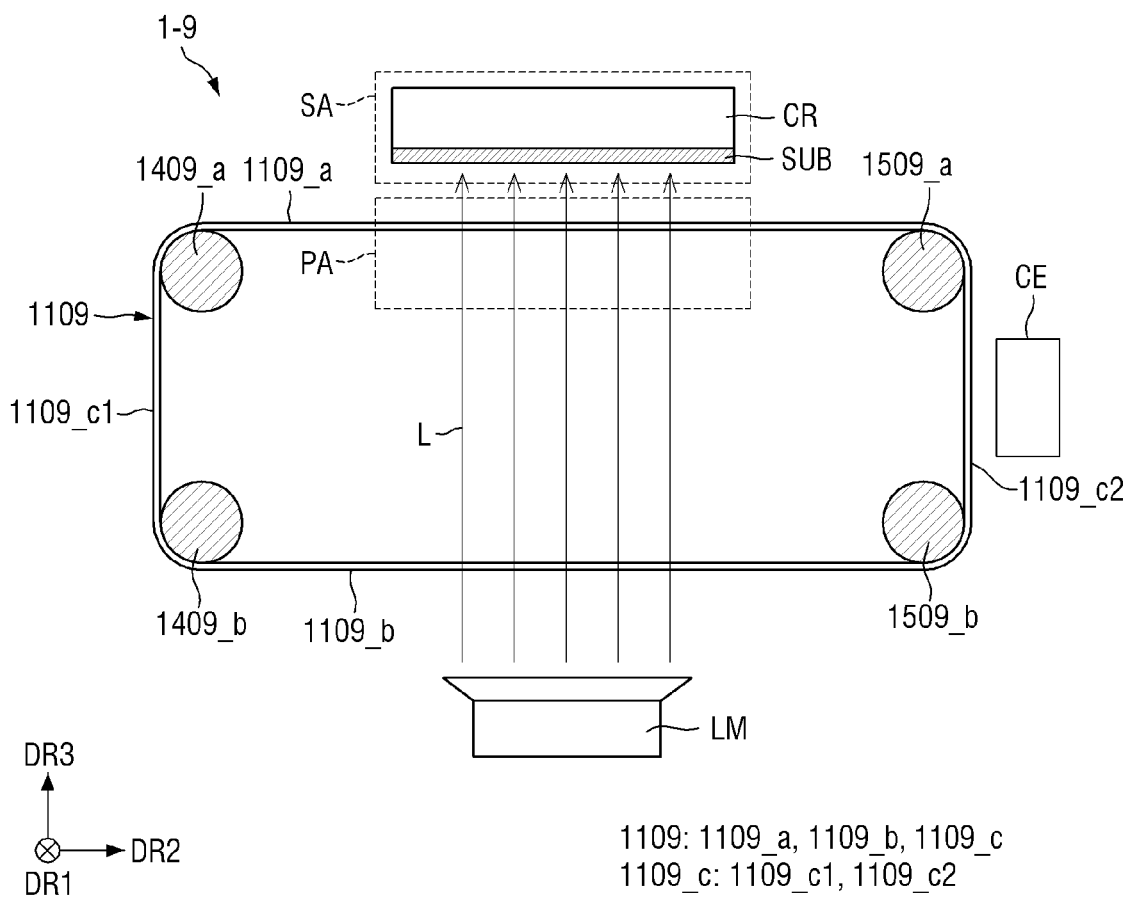
FIG. 38 is a cross-sectional view of another embodiment of a laser machining apparatus according to the invention.

FIG. 38 is a cross-sectional view of another embodiment of a laser machining apparatus according to the invention.

The embodiment of FIG. 38 is substantially identical to the embodiment of FIG. 33 except that a laser machining apparatus 1-9 includes a plurality of feed rolls and take-up rolls, and therefore the redundant descriptions will be omitted.

Specifically, although the number of feed rolls is equal to the number of take-up rolls in the example shown in FIG. 38, the number of feed rolls may be different from the number of take-up rolls.

As shown in FIG. 38, the feed rolls may include an upper feed roll 1409_a and a lower feed roll 1409_b, and the take-up rolls may include an upper take-up roll 1509_a and a lower take-up roll 1509_b. Although the diameter of the feed rolls is equal to the diameter of the take-up rolls in the example shown in FIG. 38, the invention is not limited thereto.

The protector 1109 of the laser machining apparatus 1-9 in this embodiment may include a protector supplying portion 1109_a extended from the upper feed roll 1409_a to the upper take-up roll 1509_a, a protector retrieving portion 1109_b extended from the lower take-up roll 1509_b to the lower feed roll 1409_b, and protector connecting portions 1109_c connecting the protector supplying portion 1109_a with the protector retrieving portion 1109_b in the protector supplier (not shown) and the protector retriever (not shown). The protector connecting portions 1109_c may include a first connecting portion 1109_c1 extended from the upper feed roll 1409_a to the lower feed roll 1409_b and a second connecting portion 1109_c2 extended from the lower take-up roll 1509_b to the upper take-up roll 1509_a. The protector supplying portion 1109_a may pass through the process area PA, and the distance between the protector supplying portion 1109_a and the substrate SUB in the third direction DR3 may be smaller than the distance between the protector retrieving portion 1109_b and the substrate SUB.

Therefore, in the laser machining apparatus in this embodiment, the area of the second connecting portion 1109_c2 of the protector connecting portions 1109_c cleaned by the cleaning device CE may increase, and accordingly, a pile of particles collected by the protector 1109 may be removed better.

Figure 39:
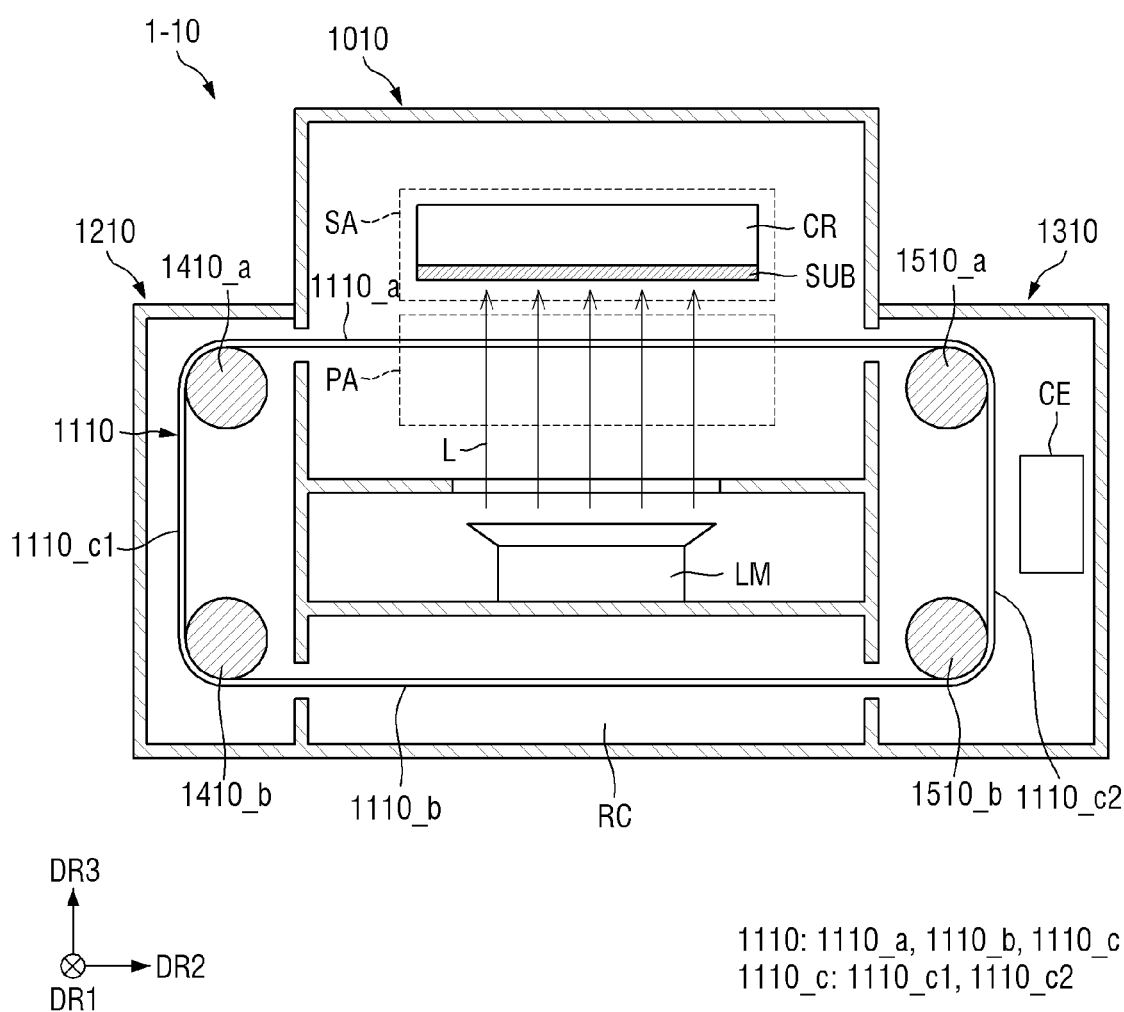
FIG. 39 is a cross-sectional view of another embodiment of a laser processing apparatus according to the invention.

FIG. 39 is a perspective view of another embodiment of a laser machining apparatus according to the invention.

The embodiment of FIG. 39 is substantially identical to the embodiment of FIG. 38 except that a laser irradiator is disposed inside a track of a protector in a laser machining apparatus 1-10 in the processing chamber 1010, and the laser machining apparatus 1-10 further includes a protector retrieval chamber below the laser module.

Specifically, in the laser machining apparatus 1-10 in this embodiment, feed rolls may include an upper feed roll 1410_a and a lower feed roll 1410_b, and take-up rolls may include an upper take-up roll 1510_a and a lower take-up roll 1510_b, and a protector retrieval chamber RC disposed below the laser irradiator LM may be further included. The protector 1110 in this embodiment may include a protector supplying portion 1110_a extended from the upper feed roll 1410_a to the upper take-up roll 1510_a, a protector retrieving portion 1110b extended from the lower take-up roll 1510_b to the lower feed roll 1410_b, and protector connecting portions 1110_c connecting the protector supplying portion 1110_a with the protector retrieving portion 1110_b in the protector supplier 1210 and the protector retriever 1310. The protector connecting portions 1110_c may include a first connecting portion 1110_c1 extended from the upper feed roll 1410_a to the lower feed roll 1410_b and a second connecting portion 1110_c2 extended from the lower take-up roll 1510_b to the upper take-up roll 1510_a. The protector supplying portion 1110_a may pass through the process area PA, and the protector retrieving portion 1110_b may pass through the protector retrieval chamber RC.

Referring to FIG. 39, the laser beam L irradiated from the laser irradiator LM may pass through only the protector supplying portion 1110_a. Therefore, the laser machining apparatus in this embodiment may prevent a decrease in transmittance of the laser beam L. In addition, particles peeled off from the substrate SUB are collected on one surface of the protector supplying portion 1110_a, and the opposite surface of the protector is engaged with the feed roll and the take-up roll, so that the cleaning device CE may be disposed relatively freely. Accordingly, by disposing the cleaning device under the protector retrieving portion 1110_b to increase the cleaning area, it is possible to increase the efficiency of cleaning.

Figure 40:
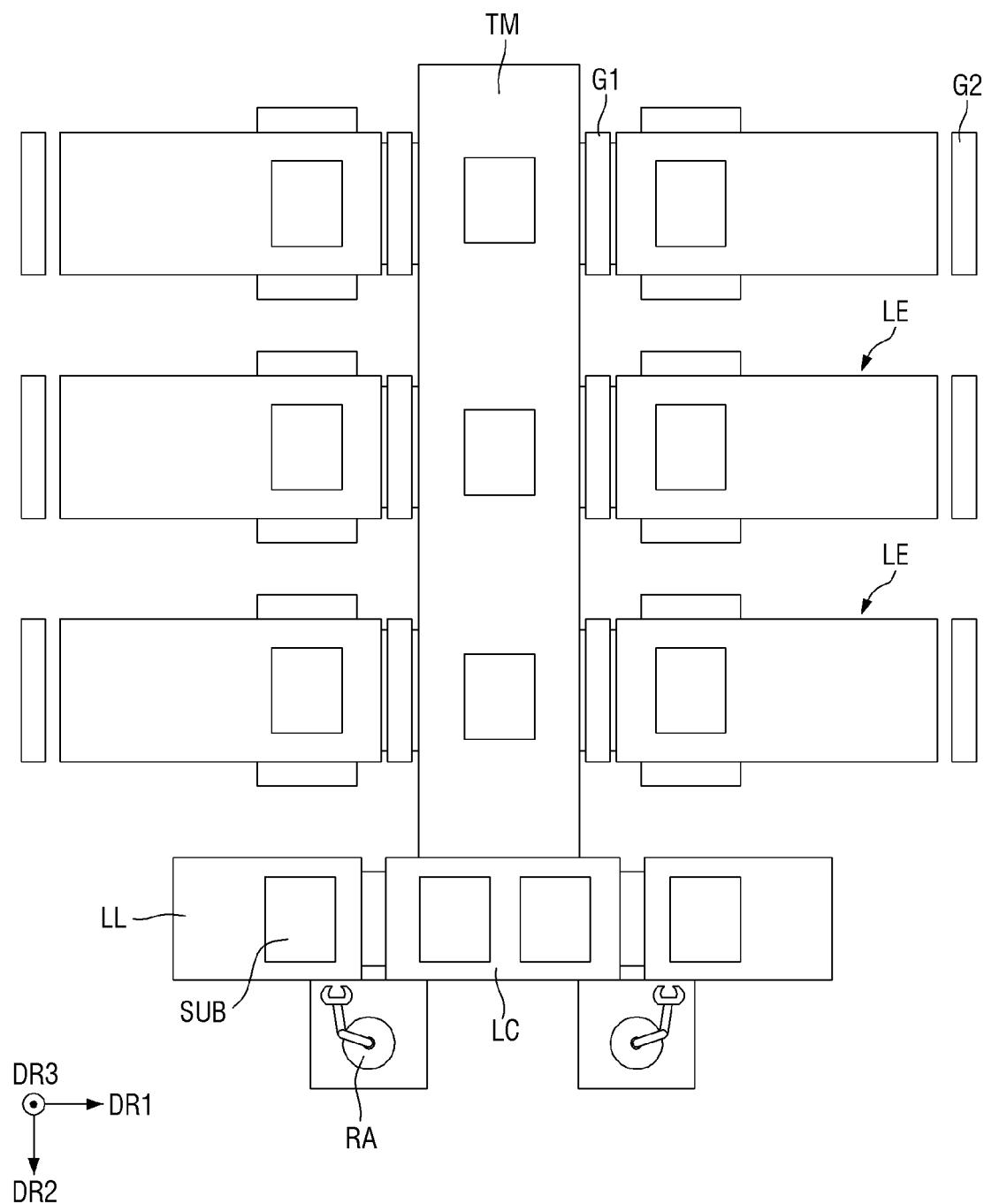
FIG. 40 is a plan view showing an embodiment of a part of a substrate processing facility including a laser machining apparatus according to the invention.

FIG. 40 is a plan view showing an embodiment of a part of a substrate processing facility including a laser machining apparatus according to the invention.

Referring to FIG. 40, a substrate processing facility may include a plurality of laser machining apparatuses LE, first gates G1, second gates G2, a transfer module TM, a load lock chamber LC, loading modules LL, and robot arms RA.

The loading modules LL and the load lock chamber LC may be disposed in the same row, i.e., in the same row in the first direction DR1 inside the substrate processing plant when viewed from the top. The transfer module TM and the laser machining apparatus LE may be disposed in different rows from the row in which the loading modules LL and the load lock chamber LC are disposed inside the substrate processing plant when viewed from the top.

The loading module LL may include a plurality of loading chambers, for example, two loading chambers. Although one load lock chamber LC is shown in the embodiment of FIG. 40, the number of load lock chambers LC is not limited thereto. More than one load lock chambers LC may be disposed. The load lock chamber LC may be connected directly to one side of the loading module LL.

The robot arms RA may move the substrate SUB from the loading modules LL to the load lock chamber LC. Although the robot arms RA are disposed outside the loading modules LL in the example shown in FIG. 40, the invention is not limited thereto. In an embodiment, the robot arms RA may be disposed inside the loading modules LL, for example.

The load lock chamber LC may be blocked from the outside air of the substrate processing plant. The internal pressure of the load lock chamber LC may be adjusted so that it is equivalent to the pressure of the outside air of the substrate processing plant when the substrate SUB is transferred from the loading modules LL to the load lock chamber LC. When the substrate SUB accommodated in the load lock chamber LC is transferred to the transfer module TM, the pressure in the load lock chamber LC may be adjusted to a vacuum pressure.

An inlet door (not shown) may be installed between the load lock chamber LC and the transfer module TM to control the loading and unloading of the substrate SUB by opening and closing the passage. The inlet door may connect or disconnect between the inside of the load lock chamber LC and the inside of the transfer module TM. The load lock chamber LC may adjust the pressure in the load lock chamber LC to a vacuum pressure before the inlet door is opened.

The inside of the transfer module TM is maintained in a vacuum state, and a transfer mechanism for moving the substrate SUB to the laser machining apparatus LE may be disposed.

The transfer module TM may be disposed at the center of the substrate processing apparatus in the vertical direction, i.e., in the second direction DR2. The transfer module TM may include a transfer mechanism for loading the substrate SUB into the laser machining apparatus LE. Although the transfer module TM has a cuboid shape including the longer sides in the second direction DR2 and the shorter sides in the first direction DR1 in the example shown in FIG. 40, the shape of the transfer module TM is not limited thereto. For convenience of illustration, however, it is assumed herein that the transfer module TM has a cuboid shape including the longer sides in the second direction DR2 and the shorter sides in the first direction DR1.

The transfer module TM may include a left side surface and a right side surface in the direction indicated by the arrow of the first direction DR1, and may include a rear surface and a front surface sequentially in the direction indicated by the arrow of the second direction DR2.

The plurality of laser machining apparatuses LE may be disposed on the left side and the right side of the transfer module TM to be arranged in parallel in the second direction DR2. The processing chamber of the laser machining apparatus LE may have a cuboid shape including the shorter side in the second direction DR2 and the longer sides in the first direction DR1, but the shape of the processing chamber of the laser machining apparatus LE is not limited thereto. The plurality of laser machining apparatuses LE may be arranged symmetrically with respect to the transfer module TM. Specifically, the plurality of laser machining apparatuses LE arranged on the left side of the transfer module TM and the plurality of laser machining apparatuses LE arranged on the right side of the transfer module TM may be arranged in the same column and parallel to each other in the second direction DR2 so that they are symmetrical to each other with respect to the transfer module TM.

The first gate G1 may be disposed between the transfer module TM and the laser machining apparatus LE, through which the substrate SUB may enter and exit. A substrate SUB before laser processing may be moved from the loading modules LL to the transfer module TM through the load lock chamber LC. The substrate SUB moved to the transfer module TM may be moved to the plurality of laser machining apparatuses LE by the transfer mechanism of the transfer module TM.

Laser processing may be carried out on the transferred substrate SUB in the laser machining apparatus LE. After the laser processing has been carried out on the substrate SUB, the substrate SUB may be transferred by the transfer mechanism again through the first gate G1 between the transfer module TM and the laser machining apparatus LE, or may be moved to the end of the laser machining apparatus LE in the second direction DR2 to be transferred to another processing apparatus through the second gate G2.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A laser machining apparatus comprising:
a processing chamber;
a window disposed in a surface of the processing chamber;
a substrate carrier disposed inside the processing chamber and facing the window;
a laser irradiator which irradiates a laser onto the substrate carrier through the window;
a protector supplier disposed on a side of the processing chamber;
a protector retriever disposed on an opposite side of the processing chamber opposite to the side of the processing chamber; and
a protector which connects the protector supplier with the protector retriever, wherein at least a portion of the protector is disposed between the substrate carrier and the window in the processing chamber.

2. The laser machining apparatus of claim 1,
wherein the protector supplier and the protector retriever move the protector from the protector supplier toward the protector retriever in a first mode.

3. The laser machining apparatus of claim 2,
wherein the protector supplier and the protector retriever move the protector from the protector retriever toward the protector supplier in a second mode.

4. The laser machining apparatus of claim 1, further comprising:
a tension device which is disposed on the protector and maintains tension of the protector.

5. The laser machining apparatus of claim 1,
wherein the protector includes a film having flexibility and laser transmittance.

6. The laser machining apparatus of claim 5,
wherein the protector includes at least one of polyethylene terephthalate, polyvinyl chloride, polypropylene and polyethylene.

7. The laser machining apparatus of claim 1, further comprising:
a cleaning device which cleans the protector retrieved in the protector retriever.

8. The laser machining apparatus of claim 1,
wherein the protector supplier comprises a feed roll, and the protector retriever comprises a take-up roll, and
wherein the protector is wound around the feed roll and the take-up roll.

9. The laser machining apparatus of claim 8,
wherein the feed roll rotates in a direction in which the protector is unwound, and the take-up roll rotates in a same rotational direction and at a same rotational speed as those of the feed roll.

10. The laser machining apparatus of claim 8,
wherein the protector defines a closed loop between the feed roll and the take-up roll.

11. The laser machining apparatus of claim 10, further comprising:
a cleaning device which cleans the protector retrieved in the protector retriever.

12. The laser machining apparatus of claim 11,
wherein the protector comprises:
a protector supplying portion engaging with a lower end of the feed roll and a lower end of the take-up roll and extended from the protector supplier to the protector retriever;
a protector retrieving portion engaging with an upper end of the feed roll and an upper end of the take-up roll and extended from the protector retriever to the protector supplier; and
a protector connecting portion connecting the protector supplying portion with the protector retrieving portion in a region where the protector engages with the feed roll and with the take-up roll.

13. The laser machining apparatus of claim 12,
wherein the substrate carrier is disposed between the protector supplying portion and the protector retrieving portion.

14. A laser machining apparatus comprising:
a processing chamber comprising a process area in which a target substrate is processed, and a first gate through which the target substrate is loaded into the process area in a first direction;
a laser irradiator which irradiates a laser onto the process area in a second direction intersecting the first direction; and
a protector driver which provides a protector into the processing chamber in a third direction intersecting the first direction and the second direction.

15. The laser machining apparatus of claim 14,
wherein the first direction, the second direction and the third direction are perpendicular to one another.

16. The laser machining apparatus of claim 14,
wherein the processing chamber further comprises a second gate through which the target substrate is unloaded, and
wherein the second gate is disposed on an opposite side of the first gate, with the processing chamber therebetween.

17. The laser machining apparatus of claim 14,
wherein the protector driver comprises a protector supplier which supplies the protector, and a protector retriever which retrieves the protector.

18. The laser machining apparatus of claim 17, further comprising:
a first chamber disposed adjacent to one a side of the processing chamber; and
a second chamber disposed adjacent to an opposite side of the processing chamber opposite to the side of the processing chamber,
wherein the protector supplier is disposed inside the first chamber, and the protector retriever is disposed inside the second chamber.

19. The laser machining apparatus of claim 18, further comprising:
gate valves disposed between the first chamber and the processing chamber and between the second chamber and the processing chamber, respectively.

20. The laser machining apparatus of claim 17,
wherein the protector supplier and the protector retriever are disposed inside the processing chamber.

* * * * *